(12) United States Patent
Yun et al.

(10) Patent No.: US 7,973,343 B2
(45) Date of Patent: *Jul. 5, 2011

(54) MULTIBIT ELECTRO-MECHANICAL MEMORY DEVICE HAVING CANTILEVER ELECTRODES

(75) Inventors: Eun-Jung Yun, Seoul (KR); Min-Sang Kim, Seoul (KR); Sung-Min Kim, Incheon (KR); Sung-Young Lee, Yongin-si (KR); Ji-Myoung Lee, Yongin-si (KR); In-Hyuk Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 149 days.

This patent is subject to a terminal disclaimer.

(21) Appl. No.: 12/154,473

(22) Filed: May 23, 2008

(65) Prior Publication Data

US 2009/0097315 A1 Apr. 16, 2009

(30) Foreign Application Priority Data

May 23, 2007 (KR) .................. 10-2007-0050223

(51) Int. Cl.
*H01L 29/66* (2006.01)
*H01L 29/84* (2006.01)
*H01L 21/00* (2006.01)
(52) U.S. Cl. .................. 257/252; 257/415; 438/52
(58) Field of Classification Search .................. 257/415, 257/252; 438/52
See application file for complete search history.

(56) References Cited

U.S. PATENT DOCUMENTS

| | | | |
|---|---|---|---|
| 5,774,414 | A | 6/1998 | Melzner et al. |
| 6,054,745 | A | 4/2000 | Nakos et al. |
| 6,100,109 | A | 8/2000 | Melzner et al. |
| 6,473,361 | B1 | 10/2002 | Chen et al. |

(Continued)

FOREIGN PATENT DOCUMENTS

JP 200463605 2/2004

(Continued)

OTHER PUBLICATIONS

Decision of Grant, issued Sep. 29, 2008, in related Korean Application No. 10-2007-0050223.

(Continued)

*Primary Examiner* — N Drew Richards
*Assistant Examiner* — Michael Jung
(74) *Attorney, Agent, or Firm* — Mills & Onello, LLP

(57) ABSTRACT

A multibit electro-mechanical memory device comprises a substrate, a bit line on the substrate, a first interlayer insulating film on the bit line, first and second lower word lines on the first interlayer insulating film, the first and second lower word lines separated horizontally from each other by a trench, a spacer abutting a sidewall of each of the first and second lower word lines, a pad electrode inside a contact hole, first and second cantilever electrodes suspended over first and second lower voids that correspond to upper parts of the first and second lower word lines provided in both sides on the pad electrode, the first and second cantilever electrodes being separated from each other by the trench, and being curved in a third direction that is perpendicular to the first and second direction; a second interlayer insulating film on the pad electrode, first and second trap sites supported by the second interlayer insulating film to have first and second upper voids on the first and second cantilever electrodes, and first and second upper word lines on the first and second trap sites.

16 Claims, 18 Drawing Sheets

U.S. PATENT DOCUMENTS

| | | | |
|---|---|---|---|
| 6,625,047 B2 | 9/2003 | Coleman, Jr. | |
| 6,750,742 B2 | 6/2004 | Kang et al. | |
| 7,071,023 B2 | 7/2006 | Bertin et al. | |
| 7,122,942 B2 | 10/2006 | Song et al. | |
| 2005/0037547 A1* | 2/2005 | Bertin et al. | 438/142 |
| 2005/0230271 A1 | 10/2005 | Levon et al. | |
| 2005/0279988 A1 | 12/2005 | Bertin | |
| 2006/0128046 A1 | 6/2006 | Onishi | |
| 2006/0166393 A1 | 7/2006 | Ha et al. | |
| 2006/0181630 A1 | 8/2006 | Shioji et al. | |
| 2007/0015303 A1 | 1/2007 | Bertin et al. | |
| 2008/0048246 A1* | 2/2008 | Yun et al. | 257/324 |
| 2008/0137404 A1 | 6/2008 | Park | |
| 2008/0144364 A1* | 6/2008 | Lee et al. | 365/164 |
| 2008/0185668 A1 | 8/2008 | Kim et al. | |
| 2008/0198649 A1* | 8/2008 | Park | 365/174 |
| 2008/0219048 A1* | 9/2008 | Lee et al. | 365/164 |
| 2009/0053846 A1 | 2/2009 | Rueckes et al. | |
| 2009/0072296 A1* | 3/2009 | Lee et al. | 257/324 |
| 2009/0072297 A1 | 3/2009 | Lee et al. | |
| 2009/0115009 A1* | 5/2009 | Lee et al. | 257/415 |
| 2010/0038731 A1 | 2/2010 | Van Kampen et al. | |

FOREIGN PATENT DOCUMENTS

| | | |
|---|---|---|
| JP | 200031397 | 8/2010 |
| KR | 1020010032068 | 4/2001 |
| KR | 1020010107918 | 12/2001 |
| KR | 100417481 | 1/2004 |
| KR | 1020040035678 | 4/2004 |
| KR | 100434369 | 5/2004 |
| KR | 1020060085426 | 7/2006 |
| KR | 100621827 | 9/2006 |

OTHER PUBLICATIONS

Decision of Grant issued on Sep. 23, 2008 in related Korean Application No. 10-2007-0050226.

* cited by examiner

PROGRAM"1"

READ"1"

MULTIBIT ELECTRO-MECHANICAL MEMORY DEVICE HAVING CANTILEVER ELECTRODES

CROSS REFERENCE TO RELATED APPLICATIONS

This application claims priority under 35 U.S.C. §119 from Korean Patent Application No. 10-2007-0050223, filed on May 23, 2007, the contents of which are hereby incorporated by reference in their entirety for all purposes as if fully set forth herein.

FIELD OF THE INVENTION

The present invention relates to a semiconductor memory device and method of manufacturing the same. More particularly, the present invention relates to a multibit electro-mechanical memory device and a method of manufacturing the same, for programming and reading data by a switching operation performed by cantilever electrodes that are formed symmetrically relative to a trench.

BACKGROUND OF THE INVENTION

Typically, a memory device that stores data is largely classified as either a volatile semiconductor memory device or a nonvolatile semiconductor memory device. The volatile memory device principally represented as a DRAM (Dynamic Random Access Memory) or a SRAM (Static Random Access Memory), etc. is fast with regard to the input/output operation of data, but has a shortcoming in that stored contents are lost when a power supply is stopped. The nonvolatile memory device principally represented as EPROM (Erasable Programmable Read Only Memory) or EEPROM (Electrically Erasable Programmable Read Only Memory) etc., on the other hand, is slow with regard to the input/output operation of data, but has the benefit of maintaining intact the stored data even when a power supply is interrupted.

A conventional memory device commonly employs a MOSFET (Metal Oxide Semiconductor Field Effect Transistor) based on MOS (Metal Oxide Semiconductor) technology. For example, a stack gate-type transistor memory device of a stack structure adapted on a semiconductor substrate formed of silicon material, and a transistor memory device of a trench gate-type having a structure buried in the semiconductor substrate, are under development. However, a width and length of the channel in the MOSFET must be formed with a sufficient minimum required length in order to suppress a short-channel effect. Further, a thickness of a gate insulation layer formed between a gate electrode formed on the channel and the semiconductor substrate must be extremely thin. Due to these fundamental problems, it is difficult to realize a memory device of a nano-level ultra microstructure for the MOSFET.

Memory devices are being researched to replace the MOSFET described above with new devices that do not experience the abovementioned undesirable characteristics. Micro electro-mechanical system (MEMS) and nano electro-mechanical system (NEMS) technology applied to suspend bridge memory (SBM) are becoming an issue. One such nonvolatile memory device using the MEMS technology is disclosed in U.S. Pat. No. 6,054,745, incorporated herein by reference in its entirety.

FIG. 1 is a schematic sectional view of a memory device according to a conventional art.

As shown in FIG. 1, a conventional memory device is obtained by forming an FET (Field Effect Transistor) sensor 221, attractive electrode part 223, and cantilever electrode supporter 225, which are distinguished from one another, on a shallow trench isolation (STI) layer 224 formed on a substrate. The FET sensor 221 comprises a polysilicon gate electrode 230 and a source/drain region 227. A cantilever electrode 240 is also formed such that one side of the cantilever electrode 240 is supported by, and electrically connected to, the cantilever electrode supporter 225, wherein the cantilever electrode 240 is distanced by a predetermined height from the attractive electrode part 223 and the FET sensor 221. The cantilever electrode 240 can be curved toward the attractive electrode 232 by an electric field induced by the attractive electrode part 223. Then, even when the electric field induced by the attractive electrode part 223 is eliminated, the cantilever electrode 240 can maintain its curved state by an electric field induced from electrons held by a polysilicon gate electrode 230 of the FET sensor 221. For example, the polysilicon gate electrode 230 corresponds to a floating electrode of a flash memory device, for capturing electrons tunneled through a tunnel oxide layer that is formed of a dielectric formed on a source-drain region 227 of the FET sensor 221. The attractive electrode part 223 and the cantilever electrode supporter 225 are formed of the same polysilicon material 232 as the polysilicon gate electrode 230. The elements under attractive electrode part 223 and the cantilever electrode supporter 225, respectively, are fabricated to be co-planar with each other in the same process, for example, as disclosed in U.S. Pat. No. 6,054,749, incorporated herein in its entirety by reference. The cantilever electrode 240 is also formed of polysilicon material in the cantilever electrode supporter 225.

That is, in a conventional memory device, a nonvolatile memory device can include an attractive electrode 232 for curving the cantilever electrode 240 by an electromagnetic force, and an FET sensor 221 including the gate electrode 230 for maintaining the curved state of the cantilever electrode 240, in a lower part of the cantilever electrode 240.

However, a conventional memory device and method of manufacturing the same such as that shown in FIG. 1 have the following problems.

In the conventional memory device and method of manufacturing the same, attractive electrode part 223 and FET sensor 221 are adapted on the same horizontal position, and the cantilever electrode 240 should have a sufficient length to cover the attractive electrode part 223 and the FET sensor 221 in an upper part of the attractive electrode part 223 and the FET sensor 221, thus there is a shortcoming of decreasing an integrated level of memory devices.

Further, in the conventional memory device and method of manufacturing the same, it is difficult to form the cantilever electrode 240 to be positioned suspended above a void in an upper portion of the attractive electrode part 223 and FET sensor 221 by a microstructure of a given length and line width, and so a yield decreases.

Further, in the conventional memory device and method of manufacturing the same, only 1 bit of data is programmed or read out for each unit cell comprising the cantilever electrode 240, attractive electrode 232, and FET sensor 221, and thus, it is difficult to store multibit data.

SUMMARY OF THE INVENTION

Accordingly, some embodiments of the invention provide a multibit electro-mechanical memory device and method of manufacturing the same, which is capable of increasing at most an integrated level of memory devices by unifying attractive electrode and FET sensor and by reducing a length of a cantilever electrode provided as a switching device. The cantilever electrode of the microstructure can be simply formed herein, thereby increasing a yield. Further, 2 or more bits of data can be input/output for a single unit cell.

In an aspect, a multibit electro-mechanical memory device comprises a substrate, a bit line extending in a first direction on the substrate, a first interlayer insulating film on the bit line, first and second lower word lines on the first interlayer insulating film, the first and second lower word lines separated horizontally from each other by a trench, and extending in a second direction that intersects the first direction, a spacer abutting a sidewall of each of the first and second lower word lines, a pad electrode inside a contact hole, wherein the contact hole is formed by removing a portion of the first interlayer insulating film exposed to the spacer on the bit line, first and second cantilever electrodes suspended over first and second lower voids that correspond to upper parts of the first and second lower word lines provided in both sides on the pad electrode, the first and second cantilever electrodes being separated from each other by the trench, and being curved in a third direction that is perpendicular to the first and second direction, a second interlayer insulating film on the pad electrode, first and second trap sites supported by the second interlayer insulating film to have first and second upper voids on the first and second cantilever electrodes; and first and second upper word lines on the first and second trap sites.

In an embodiment, the first interlayer insulating film covers an upper part of the bit line except the contact hole.

In an embodiment, the spacer comprises a side face abutting the first and second lower word lines, and comprises a silicon nitride layer formed between the first and second cantilever electrodes or a side space thereof.

In an embodiment, the first and second trap sites have a stacked structure comprising a first silicon oxide layer, a silicon nitride layer, and a second silicon oxide layer.

In an embodiment, the device further comprises a third interlayer insulating film that seals the trench at an upper part of the trench.

In an aspect, a method of manufacturing a memory device comprises forming a bit line in a first direction on a substrate, forming a first interlayer insulating film on the bit line, forming a lower word line and a first sacrifice layer in a second direction intersecting the first direction of the bit line on the first interlayer insulating film, forming a spacer on a sidewall of the lower word line and the first sacrifice layer, removing the first interlayer insulating film exposed to the spacer on the bit line and thus forming a contact hole to which the bit line is selectively exposed, forming a pad electrode inside the contact hole, forming a cantilever electrode coupled between an upper part of the pad electrode and an upper part of the first sacrifice layer in the first direction, forming a second sacrifice layer, trap site and upper word line in the second direction on the cantilever electrode formed on the lower word line; and removing the first and second sacrifice layers and thus forming voids in upper and lower parts of the cantilever electrode.

In an embodiment, the contact hole is formed by filling an area adjacent the spacer with a dummy interlayer insulating film, planarizing the dummy interlayer insulating film to have the same or similar height as the first sacrifice layer, and removing the dummy interlayer insulating film and the first interlayer insulating film.

In an embodiment, the dummy interlayer insulating film is formed to fill in the area adjacent the spacer and planarized to expose the first sacrifice layer.

In an embodiment, the method further comprises forming a second interlayer insulating film that abuts a sidewall of the second sacrifice layer, the trap site and the upper word line on the cantilever electrode formed on the pad electrode.

In an embodiment, the method further comprises removing portions the upper word line, the trap site, the second sacrifice layer, the cantilever electrode, the first sacrifice layer and the lower word line in the second direction, to form a trench, wherein the first interlayer insulating film is exposed at the bottom of the trench.

In an embodiment, the method further comprises removing the first sacrifice layer and the second sacrifice layer exposed by the trench, and forming voids in upper and lower parts of the cantilever electrode from the removed first and second sacrifice layers.

In an embodiment, the method further comprises removing the spacer, and forming a side void between the lower word line and the pad electrode from the removed spacer.

In an aspect, a method of manufacturing a multibit electro-mechanical memory device comprises forming a bit line in a first direction on a substrate, forming a first interlayer insulating film on an entire area of the substrate on which the bit line has been formed, forming a lower word line and a first sacrifice layer in a second direction intersecting the first direction of the bit line on the first interlayer insulating film, forming a spacer in a sidewall of the lower word line and the first sacrifice layer, removing the first interlayer insulating film exposed to the spacer from an upper part of the bit line and thus forming a contact hole to which the bit line is selectively exposed, forming a pad electrode inside the contact hole, forming a cantilever electrode coupled between an upper part of the pad electrode and an upper part of the first sacrifice layer in the first direction, forming a second sacrifice layer, trap site and upper word line in the second direction on the cantilever electrode formed on the lower word line, forming a second interlayer insulating film filling in a sidewall of the second sacrifice layer, the trap site and the upper word line on the cantilever electrode formed on the pad electrode, removing portions of the upper word line, the trap site, the second sacrifice layer, the cantilever electrode, the first sacrifice layer and the lower word line in the second direction to form a trench, wherein the first interlayer insulating film is exposed at a bottom of the trench, and removing the first sacrifice layer, the spacer and the second sacrifice layer exposed to the trench to form voids in upper and lower parts of the cantilever electrode.

In an embodiment, the contact hole is formed by filling an area adjacent the spacer to form a dummy interlayer insulating film planarized with the same or similar height to the first sacrifice layer, and removing the first interlayer insulating film and the dummy interlayer insulating film formed on the bit line.

In an embodiment, the dummy interlayer insulating film is formed by filling the area adjacent the spacer and planarizing the dummy interlayer insulating film to expose the first sacrifice layer.

In an embodiment, the contact hole is formed by self-aligning the spacer.

In an embodiment, the contact hole is formed by a dry or wet etching method using etching gas or etchant solution having a given selection etching rate for the dummy interlayer insulating film and the first interlayer insulating film as compared with the spacer.

In an embodiment, when the spacer is formed of polysilicon and the first interlayer insulating film is formed of silicon oxide layer, the etching gas or etchant solution contains HBr gas or HBr solution having a given selection etching rate for the silicon oxide layer as compared with the polysilicon material.

In an embodiment, the pad electrode is formed by forming conductive metal filling in the contact hole and removing the conductive metal to be planarized so as to expose the first sacrifice layer.

In an embodiment, the method further comprises forming a titanium or titanium nitride layer on the bit line exposed to the contact hole before the pad electrode is formed.

BRIEF DESCRIPTION OF THE DRAWINGS

The above and other features and advantages of the present invention will become more apparent to those of ordinary skill in the art by describing in detail preferred embodiments thereof with reference to the attached drawings. The embodiments depicted therein are provided by way of example, not by way of limitation, wherein like reference numerals refer to the same or similar elements. The drawings are not necessarily to scale, emphasis instead being placed upon illustrating aspects of the invention. In the drawings.

DETAILED DESCRIPTION OF THE INVENTION

The present invention now will be described more fully hereinafter with reference to FIGS. 2 to 18, in which embodiments are shown. This invention may, however, be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present invention are more fully described below with reference to FIGS. 2 to 18. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

The thickness of several layers and regions shown referring to the accompanied drawings are just for the clarity in the description of the invention. In addition, in the following description referred to as "existing/adapted/formed 'on' a layer or substrate," it may indicate that it is in direct contact with other layer or substrate, or that a third layer is interposed therebetween.

Figure 1:
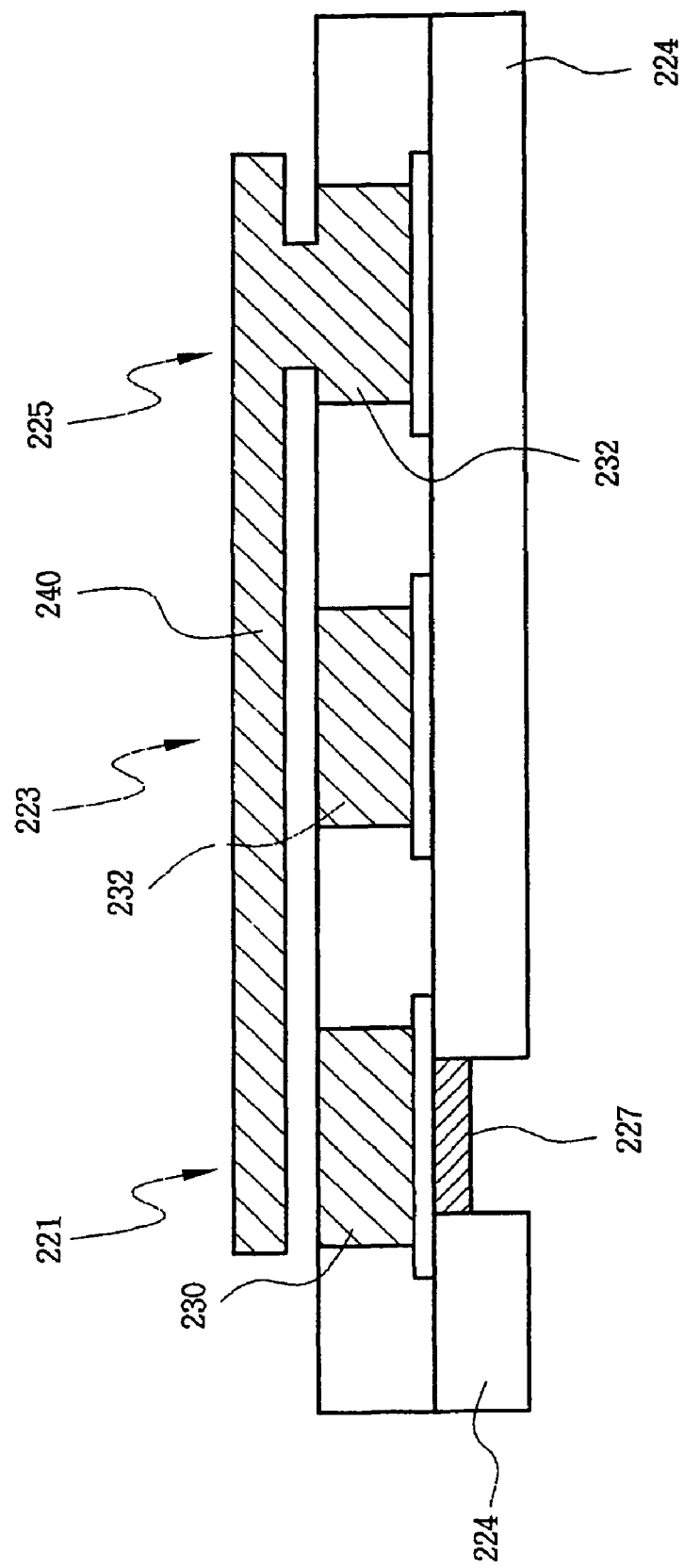
FIG. 1 is a sectional view schematically illustrating a conventional memory device.
Figure 2:
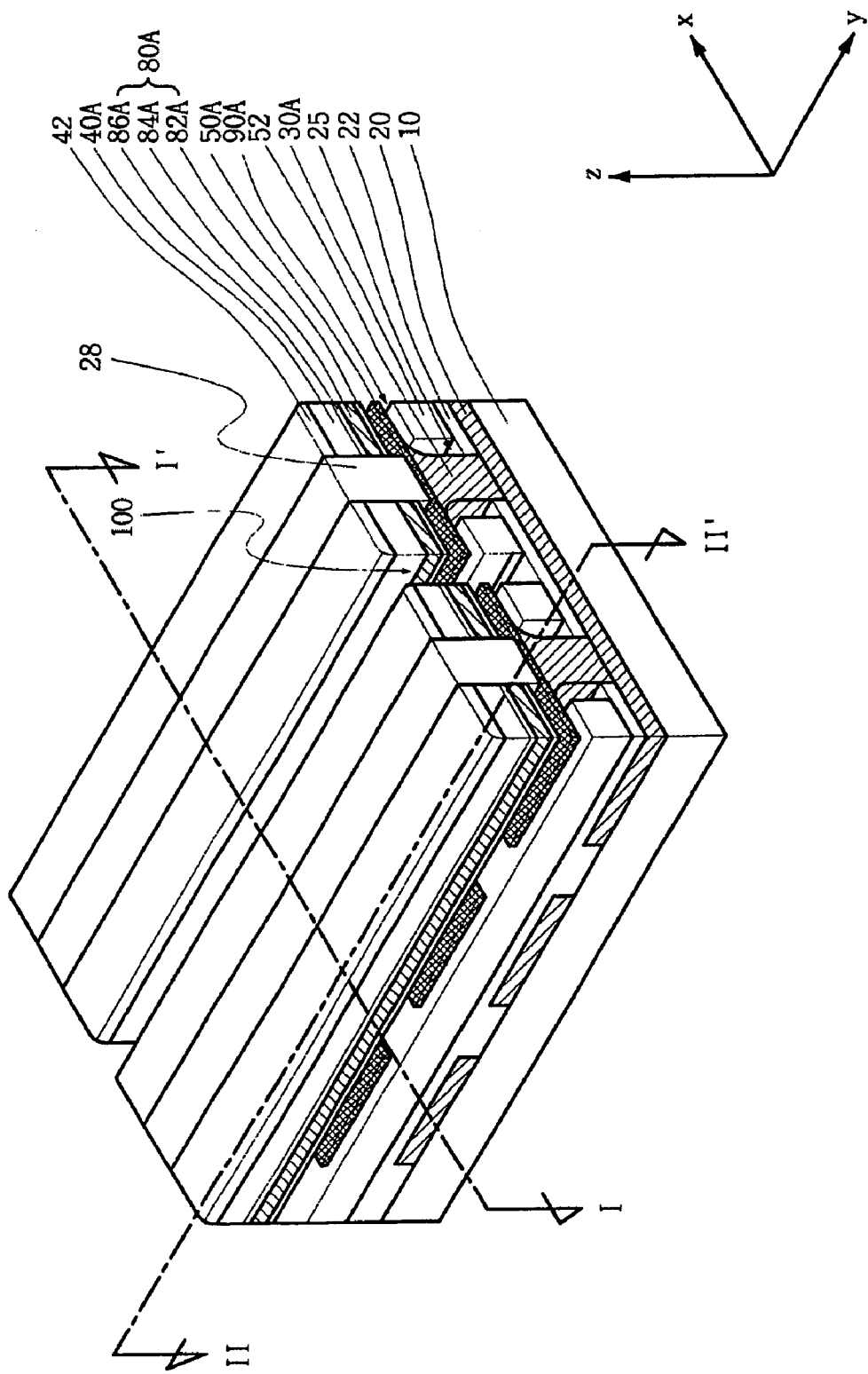
FIG. 2 is a perspective view of a multibit electro-mechanical memory device according to an embodiment of the invention.
Figure 3:
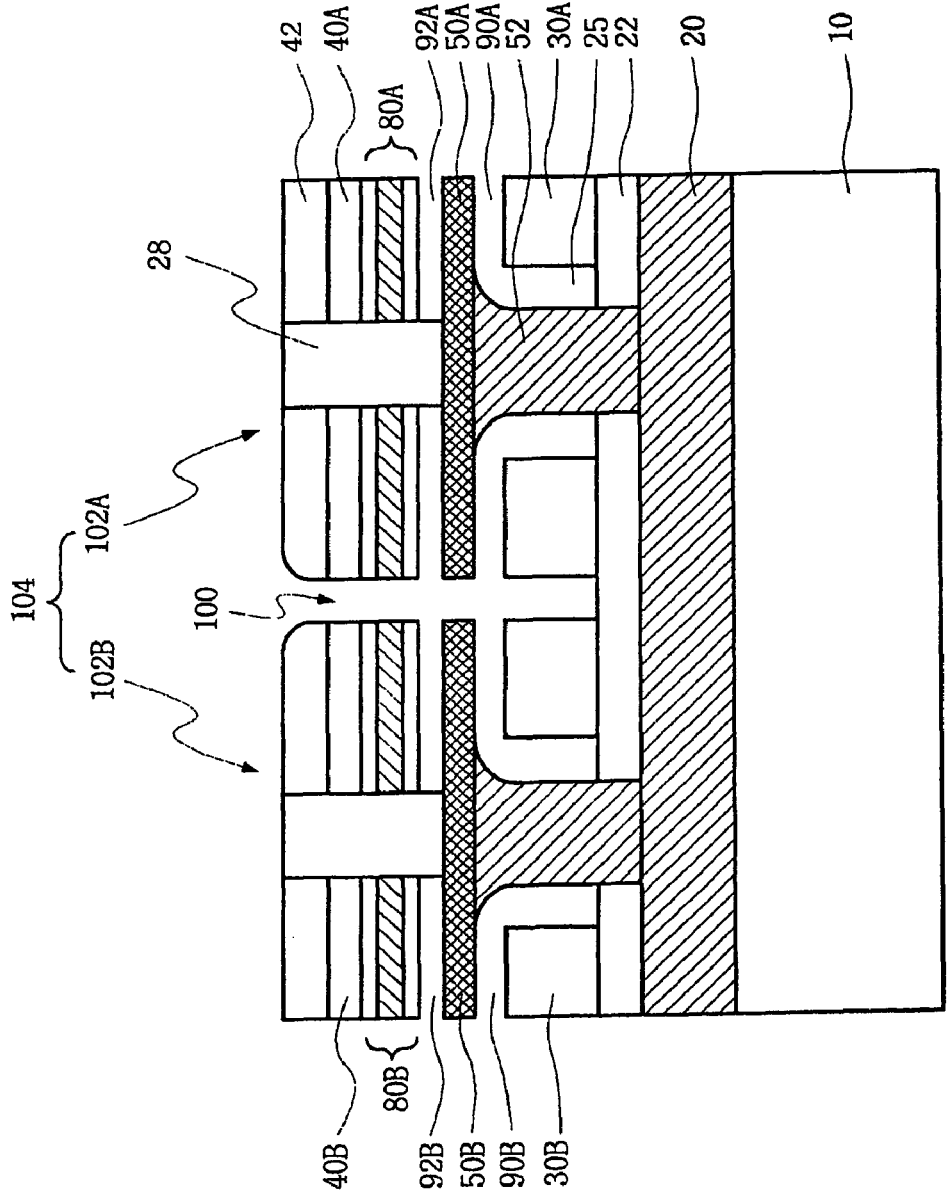
FIG. 3 is a sectional view taken along a line I~I' of FIG. 2.

FIG. 2 is a perspective view of a multibit electro-mechanical memory device according to an embodiment of the invention. FIG. 3 is a sectional view taken along line I~I' of FIG. 2.

Referring to FIGS. 2 and 3, a plurality of bit lines 20 are formed in a first direction on a substrate 10 of a given flat face. For example, in one embodiment, the substrate 10 is formed including an insulation substrate, or, in another embodiment, the substrate 10 is a semiconductor substrate having a certain degree of flexibility. The plurality of bit lines 20 include at least one of conductive metal material and a crystal silicon or polysilicon material doped with conductive impurity. The conductive material including at least one of gold, silver, copper, aluminum, tungsten, tungsten silicide, titanium, titanium nitride, tantalum, tantalum silicide, or other conductive materials known to those of skill in the art. A first interlayer insulating film 22 is formed on the plurality of bit lines 20. For example, the first interlayer insulating film 22 is a dielectric of electrically insulating the bit line 20, and contains silicon oxide or silicon oxide nitride.

A first lower word line 30A and a second lower word line 30B are horizontally separated from each other by a trench 100, and are formed in the second direction on the first interlayer insulating film 22. The first lower word line 30A and the second lower word line 30B are insulated from the substrate 10 and the plurality of bit lines 20 by the first interlayer insulating film 22. Thus, an electric signal can be applied thereto freely from the bit lines. For example, the first and second lower word lines 30A and 30B may be formed of a prominent conductive metal, i.e., gold, silver, copper, aluminum, tungsten, tungsten silicide, titanium, titanium nitride, tantalum, tantalum silicide, or other conductive metal or metal alloy materials known to those of skill in the art, similar to materials of the bit line 20.

In an embodiment, at least one spacer (shown in FIGS. 11-17) that provides electrically insulation between the first and second lower word lines 30A and 30B is formed in the second direction in an external sidewall opposite to an inner sidewall of the first and second lower word lines 30A and 30B exposed to the trench 100. In another embodiment, the spacer 24 is removed during formation of the multibit electro-mechanical memory device, wherein a remaining void 25 electrically insulates the first and second lower word lines 30A and 30B from each other. In an embodiment, the spacer 24 or void 25 is higher than the first and second lower word lines 30A and 30B. In an embodiment, the spacer 24 can be formed of silicon nitride material, and can surround a sidewall of the first and second lower word lines 30A and 30B, and also may be processed as a given space in the sidewall of the first and second lower word lines 30A and 30B. To electrically insulate the first and second lower word lines 30A and 30B, the spacer 24 may be formed of material layer such as silicon nitride surrounding the sidewall of the first and second lower word lines 30A and 30B, or may be processed as a vacant space or void 25.

The first interlayer insulating film 22 exposed to the spacer 24 is selectively removed, and thus a contact hole (see, for example, contact hole 54 shown in FIG. 12A) is formed to selectively expose the bit line 20. A pad electrode 52 is formed inside the contact hole 54, and is electrically connected to the bit line 20. The pad electrode 52 is formed to have a height the same as or similar to the spacer 24 inside the contact hole 54. The pad electrode 52 can be insulated from the first and second lower word lines 30A and 30B by the spacer 24. In an embodiment, the pad electrode 52 is formed to have a Y-shaped prop on the bit line 20. In an embodiment, the pad electrode 52 can comprise a prominent conductive metal material, i.e., gold, silver, copper, aluminum, tungsten, tungsten silicide, titanium, titanium nitride, tantalum, tantalum silicide, or other conductive metal or metal alloy materials known to those of skill in the art, like the material of the bit line 20.

First and second cantilever electrodes 50A and 50B extend between upper parts of the first and second lower word lines 30A and 30B, interposing the pad electrode 52 therebetween, the first and second cantilever electrodes 50A and 50B being provided with first and second lower voids 90A and 90B formed in a lower part thereof, and supported with a given height by the pad electrode 52. The first and second cantilever electrodes 50A and 50B are formed symmetrically on the pad electrode 52. For example, the first and second cantilever electrodes 50A and 50B are formed in the first direction, i.e., X-axis direction, being supported by the pad electrode 52. The first and second cantilever electrodes 50A and 50B may be curved in a direction of the first and second lower word lines 30A and 30B by an electrostatic force generated in an electric field that is induced in the first and second lower voids 90A and 90B. That is, when a given amount of charge having mutually different polarities is applied between the first and second cantilever electrodes 50A and 50B, and the first and second lower word lines 30A and 30B, the first and second cantilever electrodes 50A and 50B may be curved in a third direction, i.e., Z-axis direction, by an electrostatic force corresponding to an attractive force. At this time, the voids above and below the first and second cantilever electrodes 50A and 50B permit the first and second cantilever electrodes 50A and 50B to be curved up and down over the first and second lower word lines 30A and 30B. For example, the first and second cantilever electrodes 50A and 50B may be formed of titanium, titanium nitride, or carbon nanotube material, or other material those of skill in the art as possessing the characteristics required to form a cantilever electrode. The titanium and the titanium nitride are not easily oxidized even though exposed to air by the first and second lower voids 90A and 90B, and are not transformed even though they have a given level of curvature, as conductive metal having an elastic force more than a plasticity/elasticity coefficient. The carbon nanotube is tube-shaped, and is formed by joining together six-sided shapes each constructed of 6 carbon atoms, such that the six-sided shapes are associated with one another. The diameter of the nanotube ranges from several nanometers to tens of nanometers; hence, the term "carbon nanotube." Further, in the carbon nanotube, an electrical conduction is similar to copper, and heat conduction is similar to or the same as that of diamond, which is most prominent therefor in the natural world, and the stiffness of the carbon nanotube is more that 100 times that of steel. Carbon fiber is cut against the transformation of even 1%, but a carbon nanotube has a restoring force to endure against the transformation of 15% or more.

First and second trap sites 80A and 80B suspend above the first and second cantilever electrodes 50A and 50B at a height of the first and second upper voids 92A and 92B from the first and second cantilever electrodes 50A and 50B, and first and second upper word lines 40A and 40B, are formed in the second direction. The first trap site 80A is separated from the second trap site 80B, and the first upper word line 40A is separated from the second upper word line 40B, by the trench 100. In the first and second trap sites 80A and 80B, a given amount of charge applied through the first and second upper word lines 40A and 40B is tunneled and trapped inside thereof so that the trapped charge can be always held even when there is no charge applied from the outside. For example, the first and second trap sites 80A and 80B include a thin film of 'ONO (Oxide-Nitride-Oxide)', wherein a first silicon oxide 82A and 82B, respectively, silicon nitride 84A and 84B, respectively, and second silicon oxide 86A and 86B, respectively, are stacked on the first and second upper voids 92A and 92B, respectively. For example, the first and second upper word lines 40A and 40B may be formed of prominent conductive metal material, i.e., gold, silver, copper, aluminum, tungsten, tungsten silicide, titanium, titanium nitride, tantalum, tantalum silicide, or other conductive metal material known to those of skill in the art, like that of the first and second lower word lines 30A and 30B.

On the other hand, when a given charge is applied to the first and second upper word lines 40A and 40B, the charge is tunneled and captured by the first and second trap sites 80A and 80B. Then, the first and second cantilever electrodes 50A and 50B are curved upward so that the tips of the first and second cantilever electrodes 50A and 50B are in contact with the first and second trap sites 80A and 80B, by an electrical field induced by the charge applied to the first and second upper word lines 40A and 40B and the charge captured by the first and second trap sites 80A and 80B.

Even when the charge applied to the first and second upper word lines 40A and 40B and to the first and second cantilever electrodes 50A and 50B is eliminated, the first and second cantilever electrodes 50A and 50B are maintained in a curved state, intact under the state in which the tip of the first and second cantilever electrodes 50A and 50B are in direct physical contact with the first and second trap sites 80A and 80B, by an electrical field induced by the charge captured by the first and second trap sites 80a and 80B. This is why charge having a polarity opposite the charge captured by the first and second trap sites 80A and 80B is concentrated and induced in the tip of the first and second cantilever electrodes 50A and 50B, and an electrostatic attraction acts thereinto. Thus, the first and second cantilever electrodes 50A and 50B can be maintained in the curved state.

Accordingly, in the multibit electro-mechanical memory device according to embodiments of the invention, first and second trap sites 80A and 80B, in which a charge applied through first and second upper word lines 40A and 40B is tunneled and trapped, are employed, and thus, even when the charge applied to the first and second upper word lines 40A and 40B and the first and second cantilever electrodes 50A and 50B is eliminated, a curved state of the first and second cantilever electrodes 50A and 50B can be maintained, thereby realizing a nonvolatile memory device.

To curve the first and second cantilever electrodes 50A and 50B in a third direction and maintain the curved state, the first and second upper word lines 40A and 40B to which a given charge is applied, and the first and second trap sites 80A and 80B, are stacked. Therefore, the lengths of the first and second cantilever electrodes 50A and 50B are less than those lengths of conventional cantilever electrodes. Further, the electrical contact portion and attractive portion applied to the conventional art can be unified on a vertical line according to an embodiment of the invention, thereby increasing integration of memory devices.

A second interlayer insulating film 28 is formed over the pad electrode 52, to support and insulate between the first and second trap sites 80A and 80B, and between the first and second upper word lines 40A and 40B. In an embodiment, the second interlayer insulating film 28 is formed containing silicon oxide, silicon nitride, or silicon oxide nitride, to electrically insulate between the first and second cantilever electrodes 50A and 50B, and between the first and second upper word lines 40A and 40B.

Although not shown in the drawings, the first and second lower voids 90A and 90B, and the first and second upper voids 92A and 92B, may include spaces formed by removing the first sacrifice layer (for example, first sacrifice layer 60 of FIG. 9A) and second sacrifice layer (for example, second sacrifice layer 70 of FIG. 16A) exposed to the trench 100. The voids may include the spaces through which each tip of the first and second cantilever electrodes 50A and 50B moves in a third direction, i.e., Z-axis direction, perpendicular to the substrate 10.

Accordingly, the multibit electro-mechanical memory device comprises a unit cell 104 that is comprised of first and second memory units 102A and 102B separated from each other on the trench 100, or first and second memory units 102A and 102B separated from each other on the pad electrode 52. At this time, the first and second memory units 102A and 102B adjacent mutually in first direction, i.e., X-axis direction, electrically share a single bit line 20. The first and second memory units 102A and 102B of each unit cell 104 mutually adjacent each other in the second direction, i.e., Y-axis direction, may electrically share first lower word line 30A or second lower word line 30B, and may electrically share first or second upper word line 40A or 40B.

The first and second cantilever electrodes 50A and 50B separated into both sides on the trench 100 or pad electrode 52 are formed as part of the unit cell 104, which is classified as first and second memory units 102A and 102B, respectively, each performing a separate switching operation, thus, each unit cell 104 can input/output data of two or more bits.

The first and second upper word lines 40A and 40B, to which an electrical signal to switch the first and second cantilever electrodes 50A and 50B is applied, may be formed of a conductive metal material having a low resistance as compared with a conventional polysilicon material, thus reducing power consumption and increasing throughput.

Figure 4:
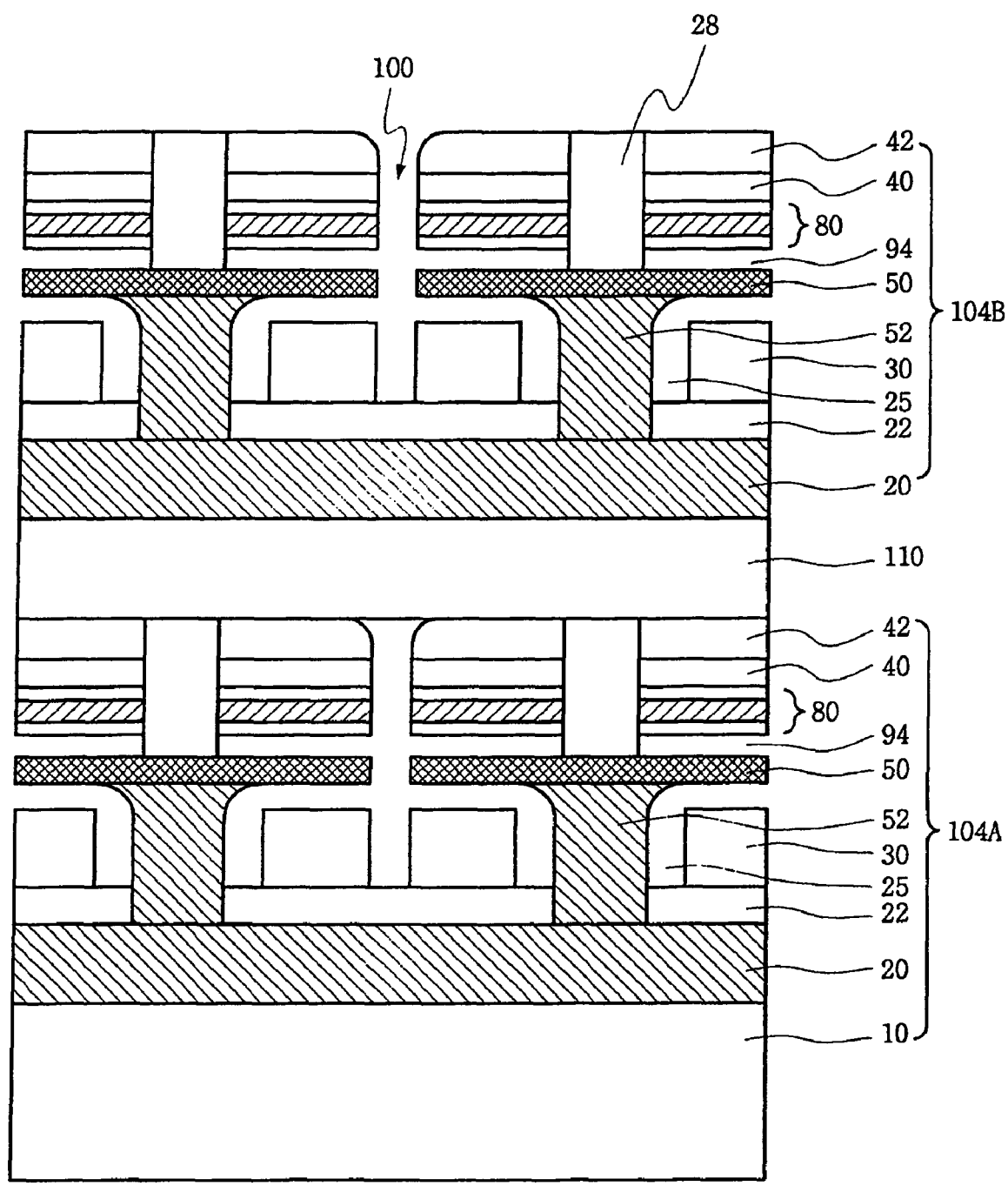
FIG. 4 is a sectional view of a stacked structure of multibit electro-mechanical memory devices shown in FIG. 3.

FIG. 4 is a sectional view of a stacked structure of multibit electro-mechanical memory devices shown in FIG. 3. A multibit electro-mechanical memory device according to an embodiment of the invention may be configured to have a stacked structure of the first unit cell 104A and the second unit cell 104B on a third interlayer insulating film 110 formed on the first unit cell 104A. The inside of the trench 100 of the first and second unit cells 104A and 104B may have a vacant vacuum state through which the cantilever electrode 50 can move upward and downward, or may be filled with non-reactive gas such as nitrogen gas or argon gas. The third interlayer insulating film 110 is formed to cover an upper part of the first unit cell 104A, to distinguish the first unit cell 104A from the second unit cell 104B. The third interlayer insulating film 110 is formed so as not to flow into the inside of void 94 through the trench 100. For example, the third interlayer insulating film 110 is formed containing polymer material formed on second interlayer insulating film 28 formed in an upper part of the trench 100. Although not shown in the drawings, bit line 20 of the first unit cell 104A and bit line 20 of the second unit cell 104B may be formed to have mutually different directions, or the trench 100 of the first unit cell 104A may be formed unequally relative to a formation line of the trench 100 of the second unit cell 104B.

Thus, the multibit electro-mechanical memory device according to embodiments of the invention may have the structure of laminating the second unit cell 104B on the third interlayer insulating film 110 formed on the first unit cell 104A that is formed on the substrate 10, thus increasing an integration of memory devices.

An operating method of multibit electro-mechanical memory device according to an embodiment of the invention is described as follows. The first and second lower word lines 30A and 30B, and the first and second cantilever electrodes 50A and 50B, and the first and second upper word lines 40A and 40B, may be each described herein as a lower word line 30, cantilever electrode 50 and upper word line 40. The first and second lower voids 90A and 90B may be described herein as a lower void 90, and the first and second upper voids 92A and 92B as an upper void 92. Further, the lower and upper voids may be all described herein as a void 94, and reference characters may be changed in the description below.

In the multibit electro-mechanical memory device according to an embodiment of the invention, given data can be programmed, deleted, or read according to a position of cantilever electrode 50. For example, when an electrical field is not induced in the void 94, the cantilever electrode 50 can be supported horizontally at a height the same as or similar to the pad electrode 52. On the other hand, when an electrical field of a given intensity is induced in the void 94, a charge of a given intensity is concentrated on a tip of the cantilever electrode 50 by the electrical field, and the cantilever electrode 50 may be curved into a third direction vertical to the substrate 10. At this time, program, delete, and readout operations can be performed by a switching operation, wherein the tip of the cantilever electrode 50 can be attached to or detached from the lower word line 30 or trap site 80.

Accordingly, program, delete, and readout operations of each of first and second memory units 102A and 102B constituting the unit cell 104 can be individually performed by controlling a difference of voltage applied to each of the bit line 20, lower word line 30 and upper word line 40. For example, a given voltage is independently applied to the first and second lower word lines 30A and 30B, and a given voltage is independently applied to the first and second upper word lines 40A and 40B, then a state of the first and second memory units 102A and 102B may be equally programmed as "0" or "1" at the same time, or may be programmed different from each other as "0" and "1". Through the unit cell 104 of the multibit electro-mechanical memory device according to an embodiment of the invention, input/output data of the respective first and second memory units 102A and 102B may be combined. At this time, the first and second memory units 102A and 102B electrically share one bit line 20. Thus, program and read operations thereof cannot be simultaneously performed, and any one of the first and second memory units 102A and 102B must have an electrical use of the bit line 20 at a given time.

Thus, in the multibit electro-mechanical memory device according to an embodiment of the invention, 2 bits of data can be input/output to/from a unit cell that is constructed of the first and second memory units 102A and 102B that are programmed to have the same or different state symmetrically at both sides of the trench 100 or pad electrode 52.

As described above, when a charge having a polarity opposite to a charge applied to the lower word line 30 and trap site 80 is applied, the cantilever electrode 50 is curved to be in contact with the trap site 80 by an electrostatic force acting as an attractive force. Further, when a charge having the same polarity as a charge applied to the lower word line 30 and trap site 80 is applied, the cantilever electrode 50 can be separated from the trap site 80 by an electrostatic force acting as a repulsive force. When the cantilever electrode 50 is curved so that the cantilever electrode 50 is in contact with the trap site 80, it should overcome an elasticity or restoring force of a given intensity. The elastic force or restoring force generally depends upon Hook's law proportionate to a movement distance, and the electrostatic force is based on Coulomb's law proportionate to the square of movement distance. The curved direction and movement direction of the cantilever electrode 50 may be each decided by an electrostatic force generated depending upon a polarity of charge and charge amount applied to the lower word line 30 and trap site 80.

FIGS. 5A to 6B are sectional views providing operations of programming to or reading data out of a multibit electro-mechanical memory device according to an embodiment of the invention.

Figure 5A:
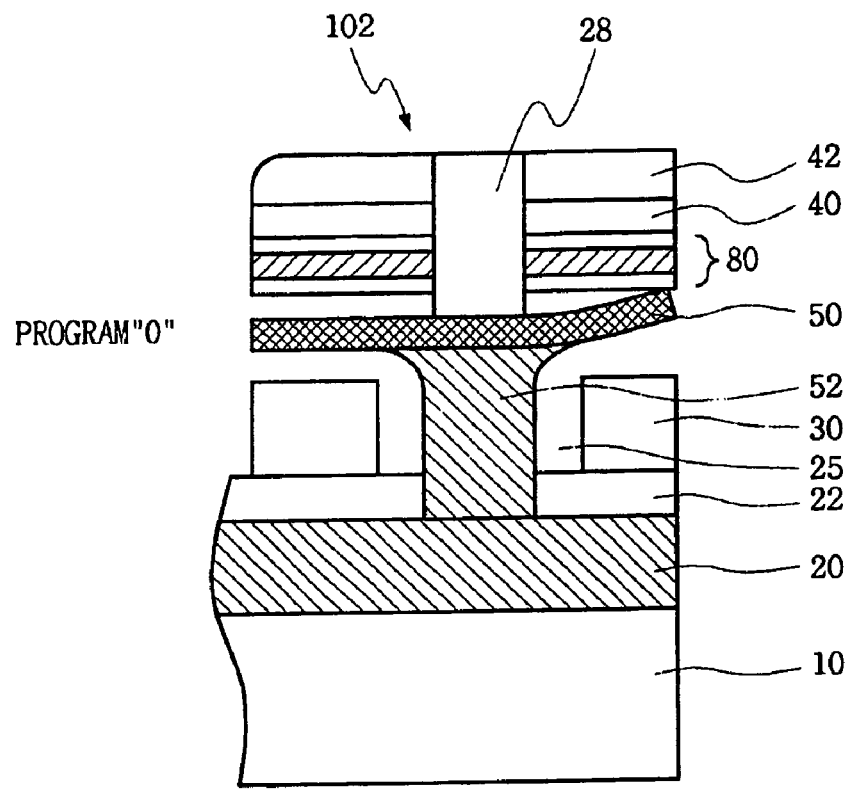
FIGS. 5A to 6B are sectional views providing operations of programming to or reading data out of a multibit electro-mechanical memory device according to an embodiment of the invention.
Figure 5B:
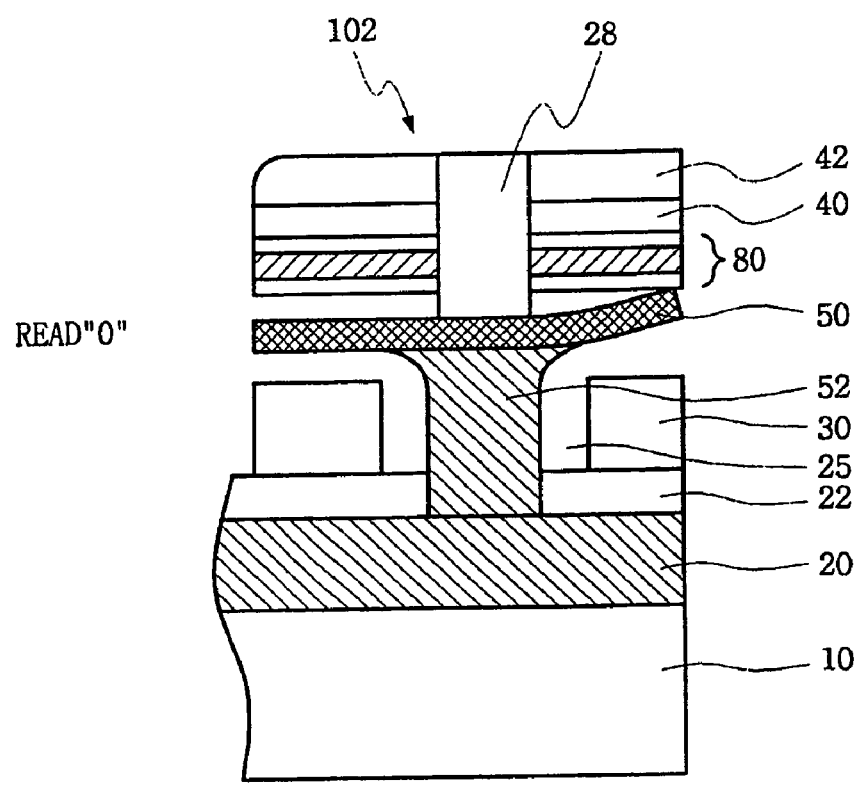

As shown in FIGS. 5A and 5B, to program data corresponding to '0' in a multibit electro-mechanical memory device according to an embodiment of the invention, a first voltage, i.e., Vpull-in, is applied to between the upper word line 40 and the bit line 20, and so tip of cantilever electrode 50 is curved upward to contact with trap site 80. At this time, programming data corresponding to '0' may be called '0' program. That is, a first voltage having a given intensity is applied to between the bit line 20 and the upper word line 40, and so the tip of the cantilever electrode 50 is curved to be in contact with the trap site 80, thereby programming data corresponding to '0'. Further, a second voltage induced between the bit line 20 and the upper word line 40, and third voltage induced between the bit line 20 and the lower word line 30, are compared, and when the second voltage is greater, data corresponding to '0' can be read out. This is why a distance between the cantilever electrode 50 electrically connected to the bit line 20 and the upper word line 40 is shorter than a distance between the cantilever electrode 50 and the lower word line 30 and so the voltage is proportionate to an inverse number of the distance.

Consequently, in a multibit electro-mechanical memory device according to an embodiment of the invention, a first voltage having a given intensity is applied to the cantilever electrode 50 electrically connected to the bit line 20 and the upper word line 40 so that the tip of cantilever electrode 50 is curved to contact with the trap site 80, thus programming data corresponding to '0'. Additionally, the second voltage induced between the bit line 20 and the upper word line 40, and the third voltage induced between the bit line 20 and the lower word line 30, are compared, and when the second voltage is greater, data corresponding to '0' can be read out.

Figure 6A:
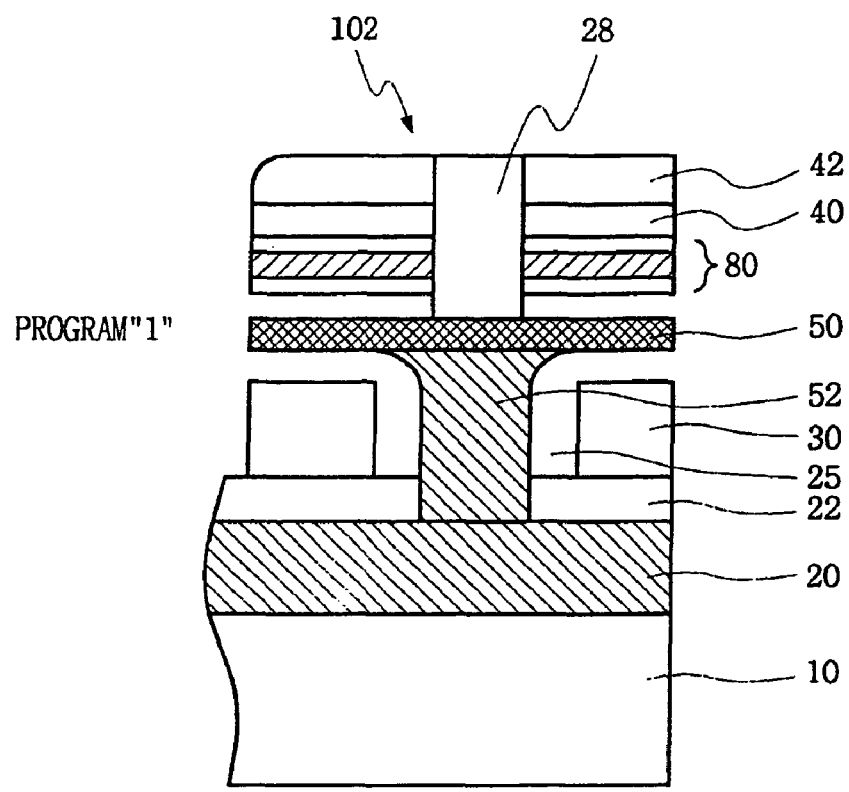
Figure 6B:
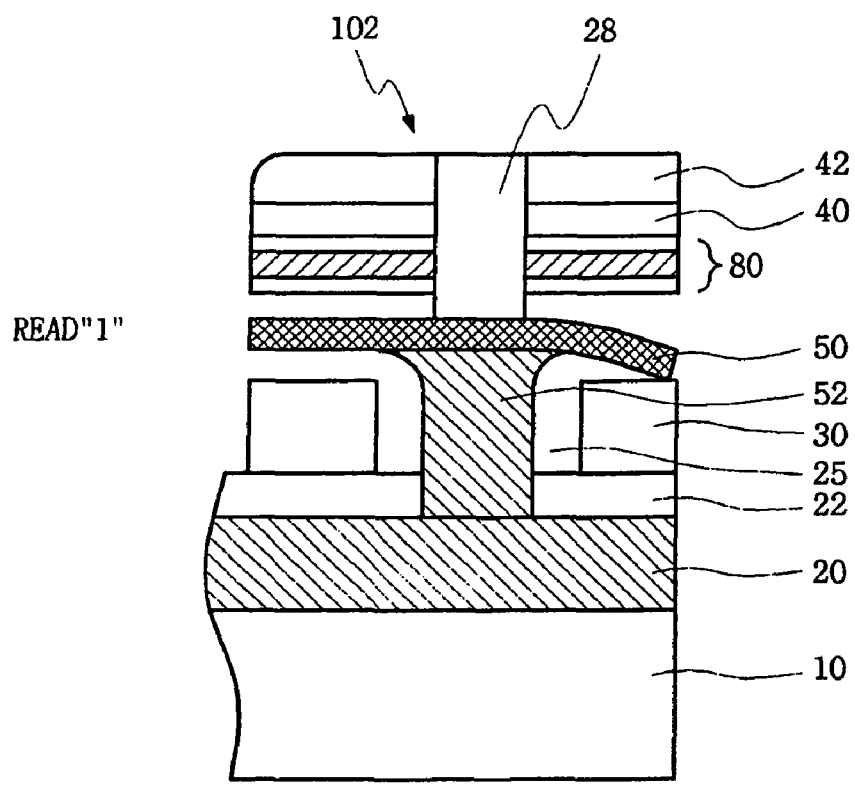

As shown in FIGS. 6A and 6B, to program data corresponding to '1' in a multibit electro-mechanical memory device according to an embodiment of the invention, a fourth voltage, i.e., Vpull-out, of a given intensity is applied to between the lower word line 30 and the bit line 20, and so the tip of cantilever electrode 50 is separated from the trap site 80, thus to return to a horizontal state of the cantilever electrode 50. When the tip of the cantilever electrode 50 is already separated from the trap site 80, it does not matter that the fourth voltage is not applied. Programming data corresponding to '1' may be called "PROGRAM '1'". Further, a second voltage induced between the bit line 20 and the upper word line 40, and the third voltage induced between the bit line 20 and the lower word line 30, are compared, and when the second voltage is greater than the third voltage, data corresponding to '1' can be read out. In reading data corresponding to '1', since the cantilever electrode 50 is positioned near the lower word line 30 as compared with the upper word line 40, the cantilever electrode 50 can be curved to electrically contact with the lower word line 30 by an electrostatic force acting as an attractive force between the cantilever electrode 50 and the lower word line 30.

Therefore, in the multibit electro-mechanical memory device according to embodiments of the invention, data of '0' or '1' can be programmed according to either a contact state or separated state between the tip of cantilever electrode 50 and the trap site 80, and data of '0' or '1' can be read out corresponding to a curved direction of the cantilever electrode 50.

Figure 7:
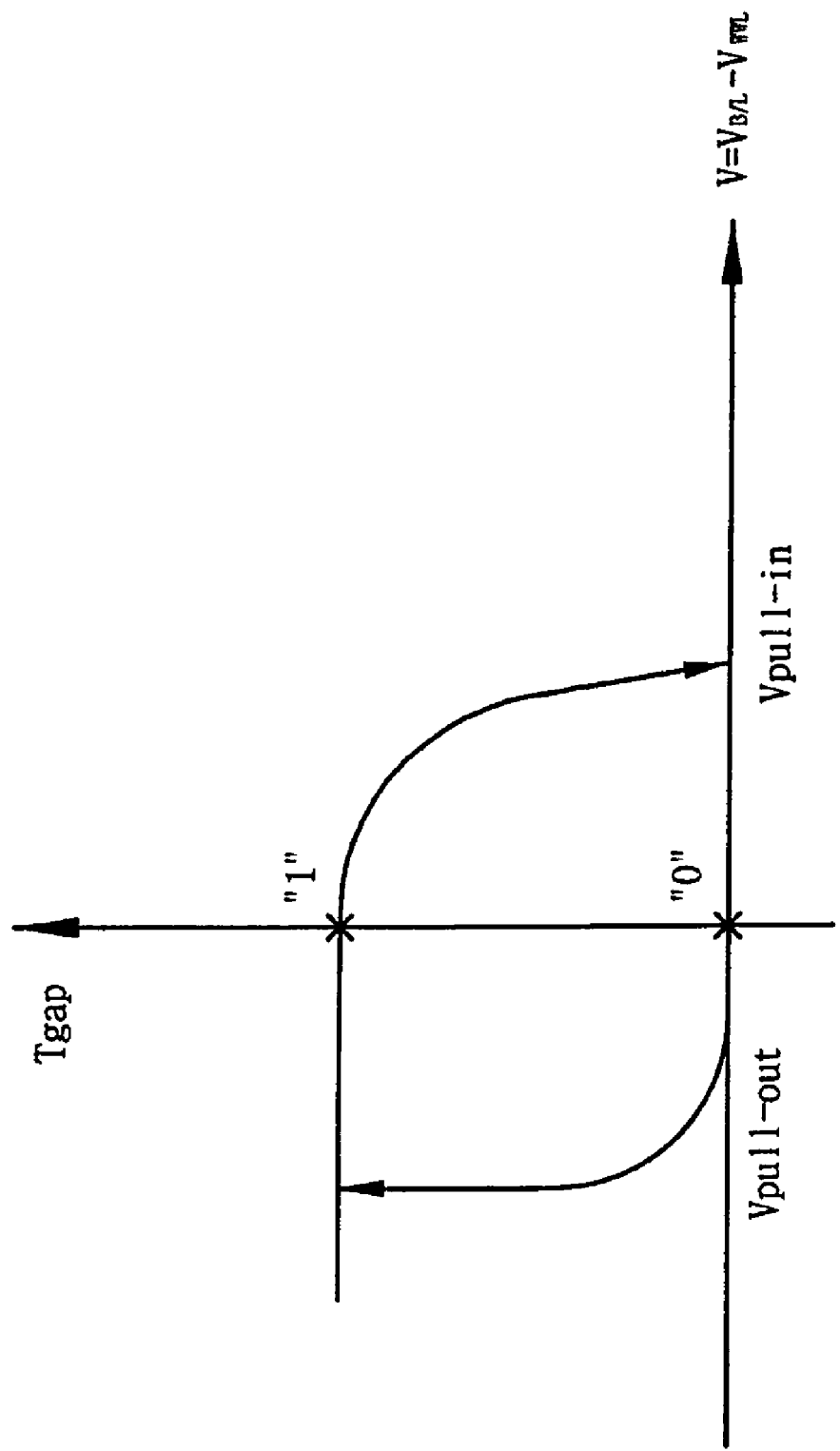
FIG. 7 is a graph illustrating a correlation between a voltage applied through a bit line and lower word line and a movement distance of a tip of a cantilever electrode in a multibit electro-mechanical memory device according to an embodiment of the invention.

FIG. 7 is a graph illustrating a correlation between a voltage applied through the bit line 20 and the upper word line 40 and a movement distance of the tip of cantilever electrode 50 in a multibit electro-mechanical memory device according to an embodiment of the invention. When a voltage of "Vpull-in" having a positive value is applied between the bit line 20 and the upper word line 40, the tip of cantilever electrode 50 is curved up to contact the trap site 80 and thus data corresponding to '0' is programmed. When a voltage of "Vpull-out" having a negative value is applied to between the bit line 20 and the upper word line 40, the tip of cantilever electrode 50 is separated from the trap site 80 and thus data corresponding to '1' can be programmed. A transverse axis indicates the magnitude of voltage, and a longitudinal axis indicates a movement distance Tgap that the tip of cantilever electrode 50 moves from the surface of the trap site 80 to the lower word line 30. When a voltage of "Vpull-in" having a positive value or a voltage of "Vpull-out" having a negative value is applied to the upper word line 40 and the cantilever electrode 50 connected to the bit line 20, the tip of cantilever electrode 50 is in contact with or separated from the trap site 80, thus programming digital data corresponding to 1 bit has a value of '0' or '1'.

At this time, the voltage of "Vpull-in" and "Vpull-out" may be decided by the following formula.

$$V = V_{B/L} - V_{WWL}$$ (Mathematical Formula)

The "V" indicates voltage of "Vpull-in" or "Vpull-out", and "$V_{B/L}$" designates a voltage applied to the bit line 20, and "$V_{WWL}$" indicates a voltage applied to the upper word line 40. At this time, the voltage of "Vpull-in" has a positive value, and the voltage of "Vpull-out" has a negative value. For example, when absolute values of the voltage of "Vpull-in" and the voltage of "Vpull-out" are the same or similar to each other, a voltage of ½*"Vpull-in" is applied to the bit line 20 and a voltage of ½*"Vpull-out" is applied to the upper word line 40 in programming data corresponding to a value of '0', thereby electrically contacting the tip of cantilever electrode 50 to the upper word line 40 through an upward curved operation of the cantilever electrode 50.

Furthermore, in programming data corresponding to '1', a voltage of ½*"Vpull-out" is applied to the bit line 20 and a voltage of ½*"Vpull-in" is applied to the upper word line 40, thereby separating a cantilever electrode 50 from the upper word line 40. Although not shown in the drawings, bit line 20, lower word line 30 and upper word line 40, to which the voltage of "Vpull-in" or "Vpull-out" is not applied, have a grounded state.

A method of manufacturing a multibit electro-mechanical memory device described above according to an embodiment of the invention is described as follows.

FIGS. 8A to 18B are sectional views illustrating processes provided to manufacture a multibit electro-mechanical memory device according to an embodiment of the invention. FIGS. 8A to 18A are sectional views of sequential processes taken along a line I~I' of FIG. 2 and FIGS. 8B to 18B are sectional views of sequential processes taken along a line II~II' of FIG. 2.

Figure 8A:
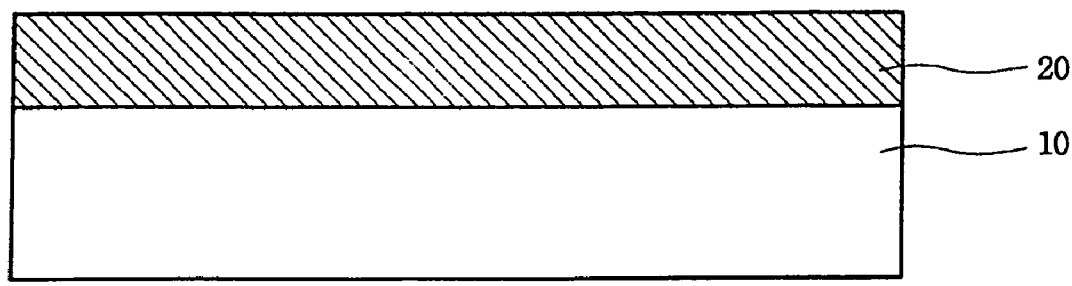
FIGS. 8A to 18B are sectional views of processes provided to manufacture a multibit electro-mechanical memory device according to an embodiment of the invention.
Figure 8B:
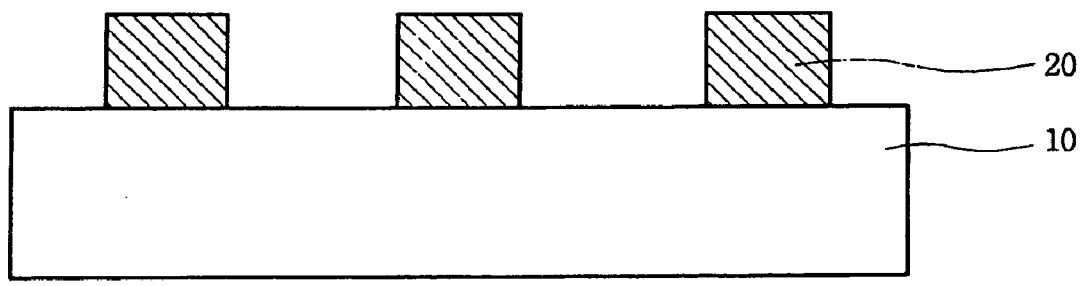

As shown in FIGS. 8A and 8B, at least one bit line 20 with a given thickness is formed in a first direction on a substrate 10. In an embodiment, when two or more bit lines 20 are formed, the bit lines 20 are parallel to each other in the first direction on the substrate 10. In an embodiment, the bit lines 20 may be formed to contain a conductive metal film such as gold, silver, copper, aluminum, tungsten, tungsten silicide, titanium, titanium nitride, tantalum, tantalum silicide formed by a physical vapor deposition (PVD) or chemical vapor deposition (CVD), or a polysilicon film or crystal silicon film doped with conductive impurity, or other conductive metal or metal alloys known to those of skill in the art. Although not shown in the drawings, the bit line 20 may be formed by aeolotropically etching the polysilicon layer or the conductive metal layer formed with a given thickness on an entire face of the substrate 10 through a dry etching method that uses a photoresist pattern or first hard mask layer (not shown) as an etch mask layer, the photoresist pattern or first hard mask layer being for shielding thereon to produce a given line width. For example, reactive gas used for the dry etching method of the conductive metal layer or polysilicon layer may contain a strong acid gas mixed with HF, fluorosulfuric acid, sulphuric acid or nitric acid. In an embodiment, the bit line 20 is formed to have a thickness of about 200 Å and a line width of about 50 Å.

Figure 9A:
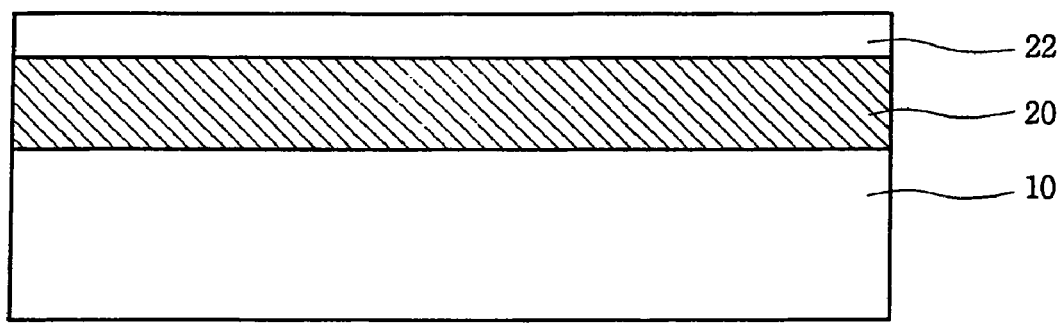
Figure 9B:
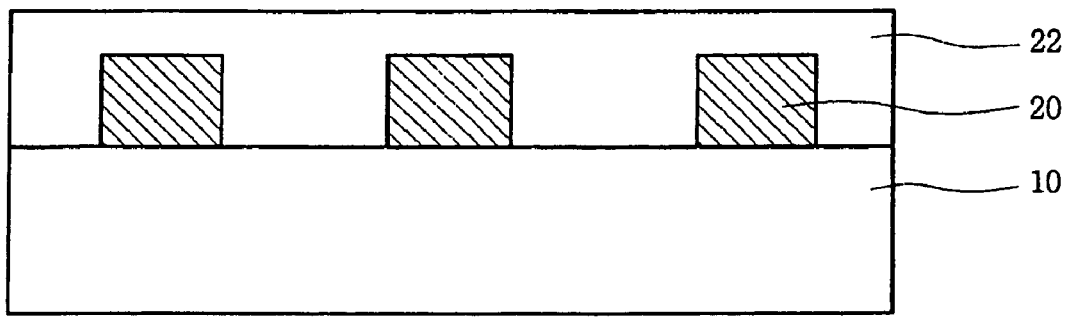

As shown in FIGS. 9A and 9B, a first interlayer insulating film 22 of a given thickness is formed on an entire face of substrate on which the bit line 20 has been formed. The first interlayer insulating film may electrically isolate the bit line 20 formed on the substrate 10 from lower word line 30 to be formed in a subsequent process, and further may function as an etch stop layer in a process of forming trench 100 to separate the lower word line 30 in a length direction of second direction. For example, the first interlayer insulating film 22 is formed including a silicon oxide or silicon nitride formed with a thickness of about 200 Å to about 800 Å through the CVD.

Figure 10A:
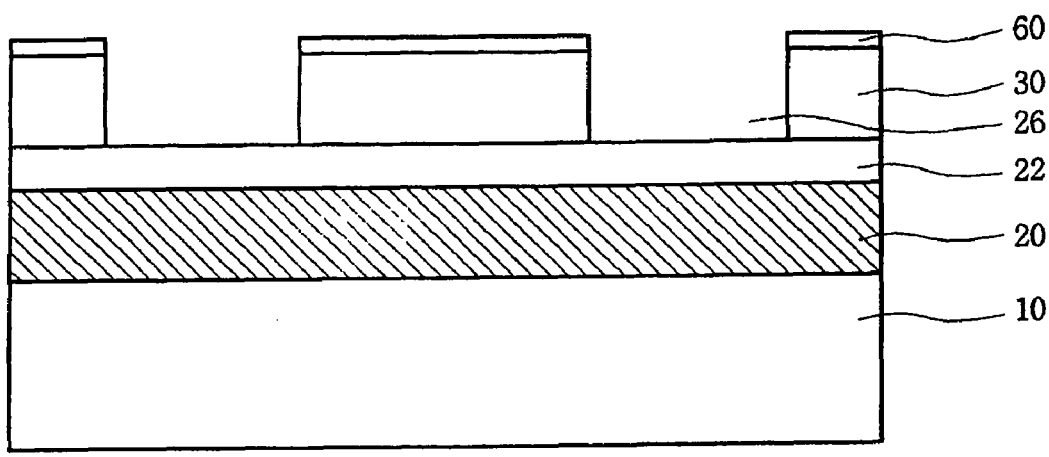
Figure 10B:
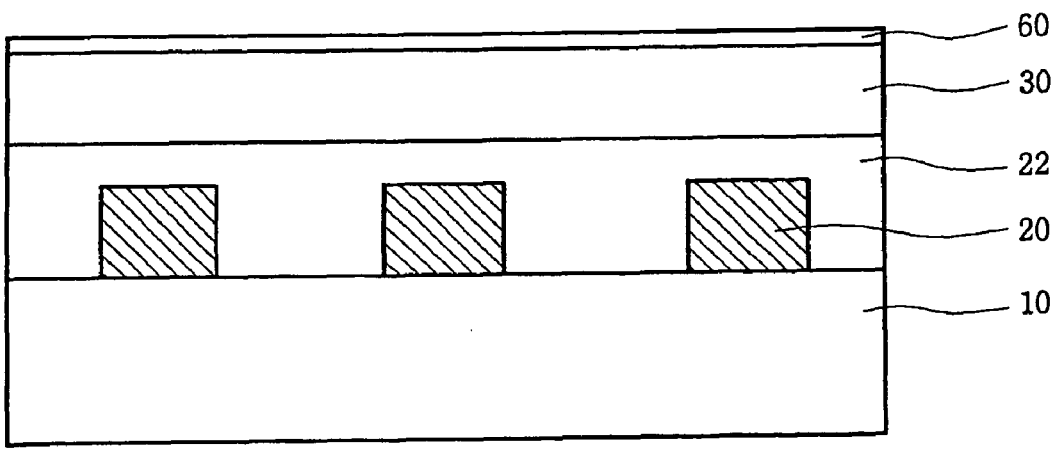

As shown in FIGS. 10A and 10B, a lower word line 30 and a first sacrifice layer 60 with a given line width are formed in a second direction that intersects the bit line 20 on the first interlayer insulating film 22. The lower word line 30 and the first sacrifice layer 60 are stacked with a given thickness on the first interlayer insulating film 22, the stack being aeolotropically etched and formed by a dry etching method that employs a photoresist pattern and a second hard mask layer (not shown) formed on the first sacrifice layer 60, as the etching mask. The second hard mask layer and the photoresist pattern are removed. The lower word line 30 is formed including a conductive metal layer having a prominent conduction, such as gold, silver, copper, aluminum, tungsten, tungsten silicide, titanium, titanium nitride, tantalum, tantalum silicide, formed with a thickness of about 200 Å through PVD or CVD, or other conductive metal or metal alloy known to those of skill in the art. The first sacrifice layer 60 includes a polysilicon material formed by an atomic layer deposition or CVD, with a thickness of about 50 Å to about 150 Å. A stack comprising the first sacrifice layer 60 and the lower word line 30 is formed to have a line width of about 50 Å, and reactive gas used for the dry etching method to pattern the stack may be gas of FC-group such as $C_xF_y$ group or $C_aH_bF_c$ group etc. The gas of FC-group may be formed of gas such as $CF_4$, $CHF_3$, $C_2F_6$, $C_4F_8$, $CH_2F_2$, $CH_3F$, $CH_4$, $C_2H_2$, $C_4F_6$, etc. or a mixture thereof.

Figure 11A:
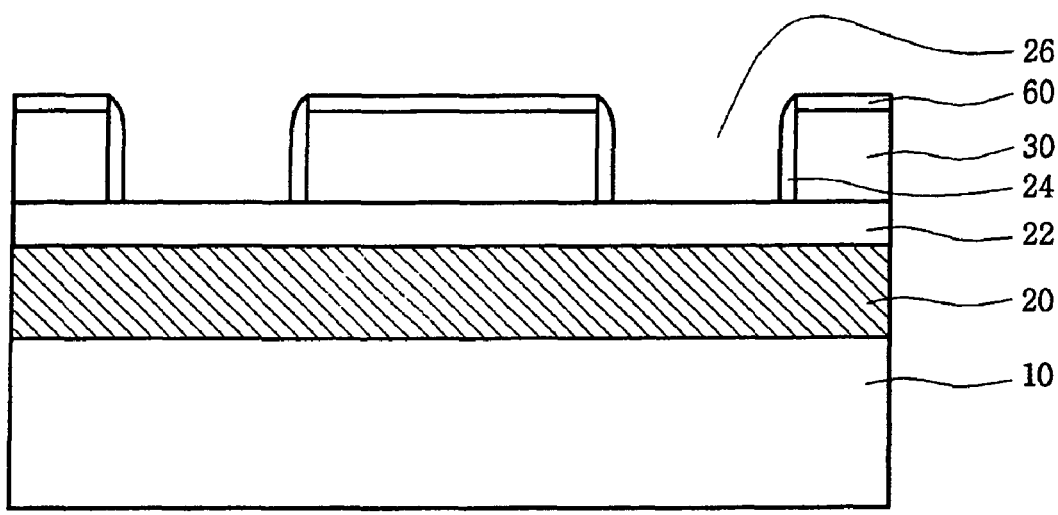
Figure 11B:
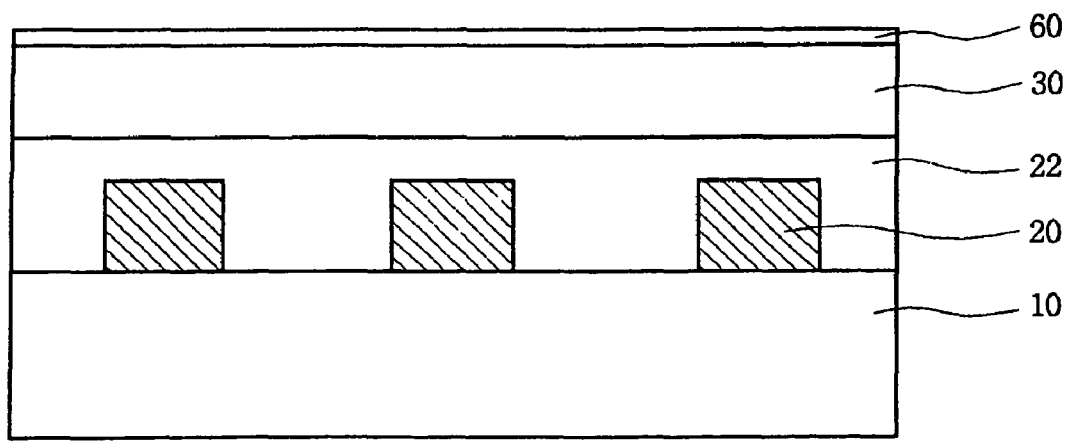

As shown in FIGS. 11A and 11B, a spacer 24 is formed on a sidewall of the lower word line 30 and the first sacrifice layer 60. The spacer 24 electrically isolates other unit cells that are adjacent the unit cell 104 including the lower word line 30. in an embodiment, the spacer 24 may be formed to surround the sidewall of the lower word line 30 and the first sacrifice layer 60, by evenly forming a thin film on an entire face of the substrate 10 on which the lower word line 30 and the first sacrifice layer 60 are formed, and aeolotropically removing the thin film through the dry etching method. At this time, the thin film may be formed of a polysilicon material formed by a CVD equal or similar to that of the first sacrifice layer 60, or formed of a silicon oxide. In an embodiment, spacers 24 are formed on sidewalls of a plurality of lower word lines 30, for example, on sidewalls of lower word lines 30 on both sides of an opening 26.

Figure 12A:
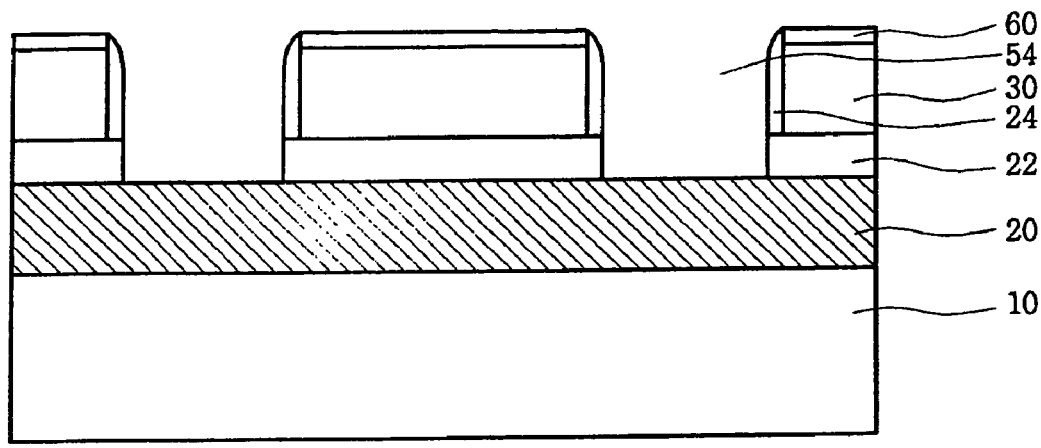
Figure 12B:
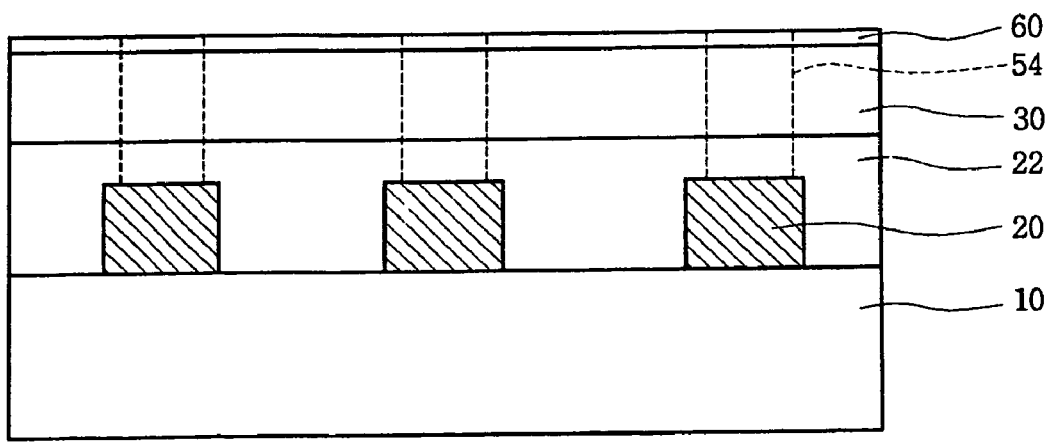

As illustrated in FIGS. 12A and 12B, a portion of the first interlayer insulating film 22 exposed by the opening 26 between spacers 24 (see FIG. 11) is removed to form a contact hole 54 for selectively exposing the bit line 20. The contact hole 54 may be formed herein by a dry etching method that uses a photoresist pattern as a mask layer, wherein the photoresist pattern covers an upper part of the spacer 24 and the first sacrifice layer 60 and selectively exposes a portion of the first interlayer insulating film 22 formed on the bit line 20 that intersects the spacer 24.

Although not shown in the drawings, the contact hole 54 may be formed by forming a dummy interlayer insulating film that buries the spacer 24 and is planarized with the same or similar height to the first sacrifice layer 60, and by sequentially removing the dummy interlayer insulating film formed on the bit line 20 adjacent to the spacer 24 and the first interlayer insulating film 22, so as to selectively expose the bit line 20. The dummy interlayer insulating film may be formed on an entire face of the substrate 10 so that an upper part of the first interlayer insulating film 22 exposed to the spacer 24 is filled, and planarized by chemical mechanical polishing until the first sacrifice layer is exposed. The contact hole 54 may be formed by removing the dummy interlayer insulating film and the first interlayer insulating film 22 through dry or wet etching method using a photoresist pattern or hard mask layer that selectively exposes the dummy interlayer insulating film, so as to expose the bit line 20. At this time, the contact hole 54 may be formed by self-aligning the spacer 24 to remove the dummy interlayer insulating film. Etching gas or etching solution used for the dry or wet etching method has a given selection etching rate for the dummy interlayer insulating film and the spacer 24. That is, when the spacer is formed of polysilicon or silicon nitride material, and the first interlayer insulating film 22 and the dummy interlayer insulating film are formed of silicon oxide material; HBr gas or HBr solution having a high selection etching rate for the silicon oxide layer as compared with the polysilicon or silicon nitride layer may be used.

Figure 13A:
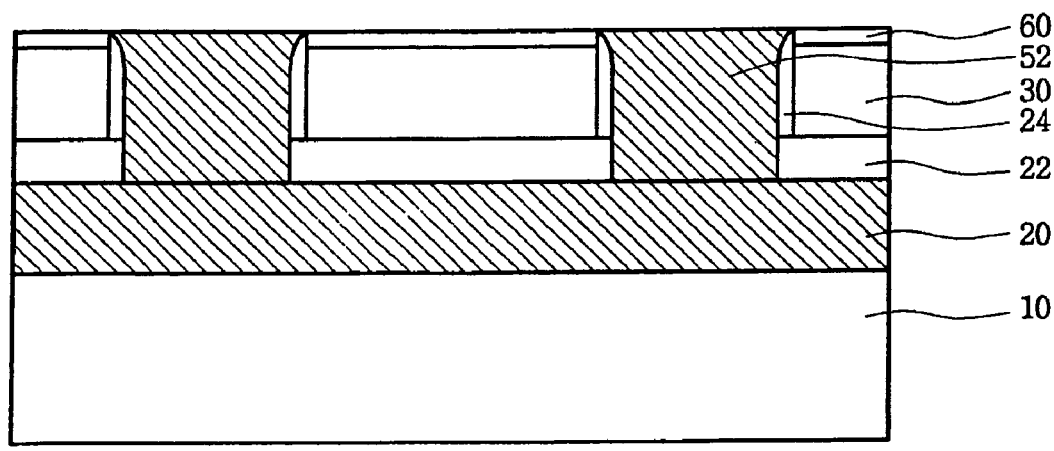
Figure 13B:
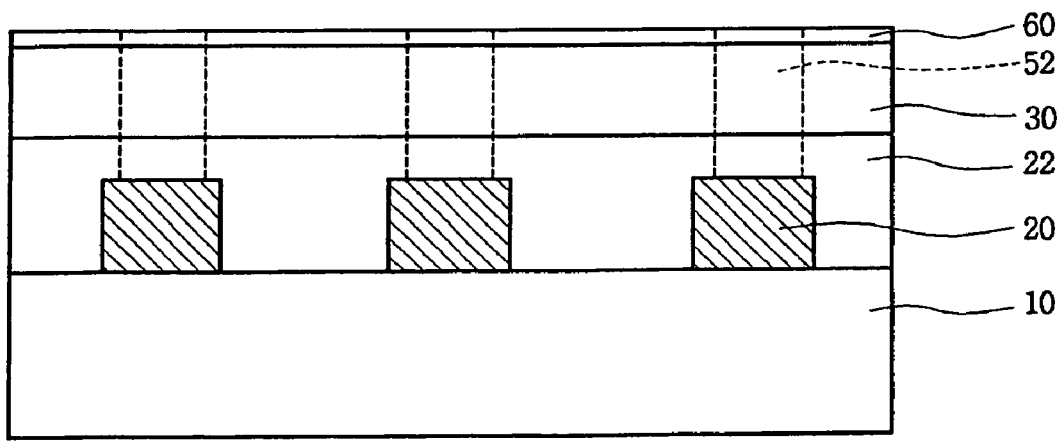

As shown in FIGS. 13A and 13B, a pad electrode 52 fills the inside of the contact hole 54. The pad electrode 52 is electrically connected to the bit line 20 exposed to the contact hole 54. Although not shown in the drawings, at least one conductive layer may be further formed to produce an ohmic contact between the bit line 20 and the pad electrode 52. For example, the pad electrode 52 may be produced by forming a conductive metal layer filled in the contact hole 54 of a given thickness through the PVD or CVD, and by removing the conductive metal layer to be planarized so as to expose the spacer 24 and the first sacrifice layer 60. Thus, the pad electrode 52 is formed to have the same or similar height as the spacer 24. Further, an oxide removing process or etching process may be further executed to remove an oxide layer formed on the surface of the bit line 20 exposed to the contact hole 54, before forming the pad electrode 52.

Figure 14A:
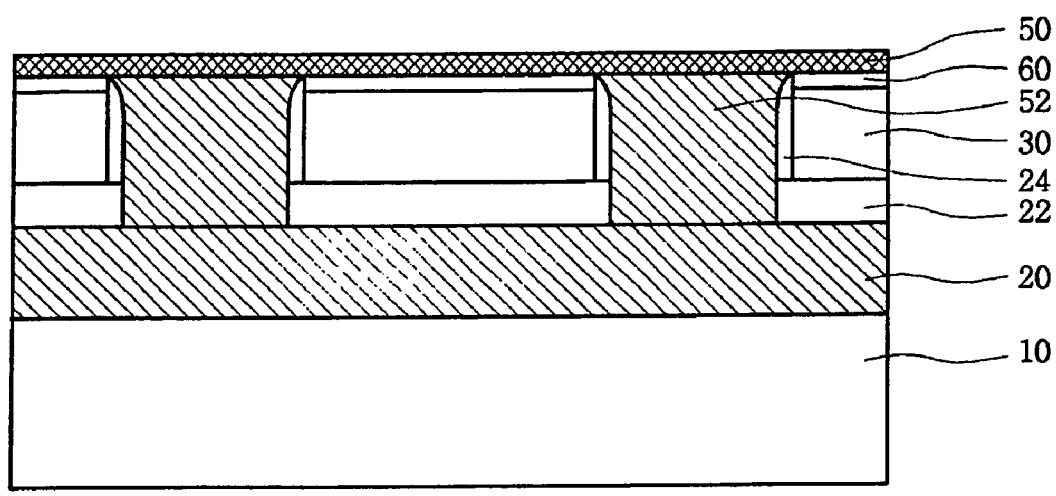
Figure 14B:
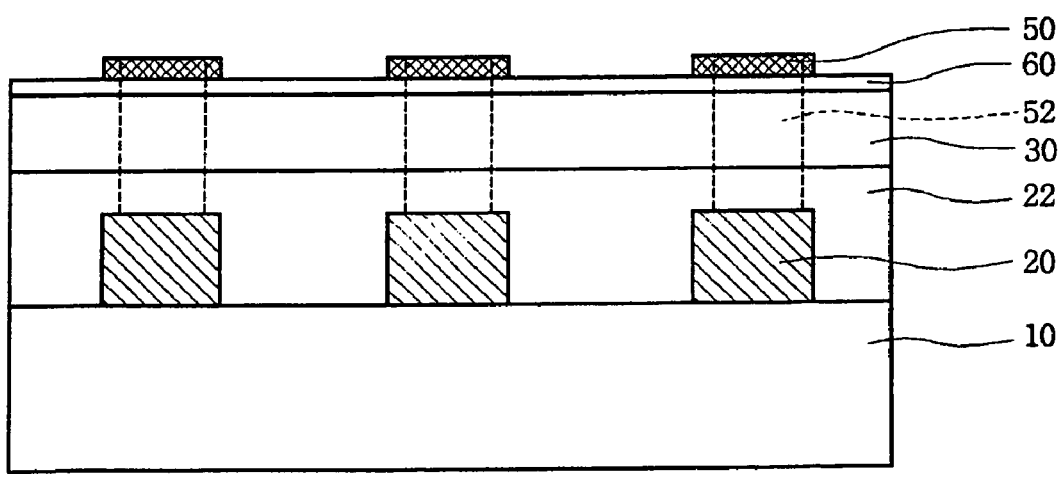

As shown in FIGS. 14A and 14B, a cantilever electrode 50 with a given line width is formed on the pad electrode 52, extending over a top portion of the spacer 24 and then crossing an upper portion of the first sacrifice layer 60, lower word line 30, and the first interlayer insulating film 22, the cantilever electrode 50 extending in a direction ranging from a third direction to the first direction. The cantilever electrode 50 has the same or similar line width as the bit line 20 and is electrically coupled to the bit line 20 on the pad electrode 52, spacer 24 and first sacrifice layer 60, and therefore may be referred to herein as an upper bit line. At this time, the upper bit line may be formed as the cantilever electrode 50, which has a node that is divided by a trench 100 formed in a subsequent process. For example, the cantilever electrode 50 may be formed of titanium, titanium nitride, or carbon nanotube to have a thickness of about 30 Å through about 50 Å through the PVD, CVD or electrical discharge. At this time, the cantilever electrode 50 may be patterned and formed through the dry etching method that employs a photoresist pattern or third hard mask layer (not shown) as an etching mask, the photoresist pattern or third hard mask layer shielding the titanium, titanium nitride or carbon nanotube formed on the bit line 20. The third hard mask layer is removed in the patterning of the cantilever electrode 50.

Accordingly, in a method of manufacturing a multibit electro-mechanical memory device according to an embodiment of the invention, cantilever electrode electrically connected to the bit line may be formed on an upper portion of the bit line 20 and the lower word line 30 that are isolated from each other by the first interlayer insulating film, thereby resulting in an increase in the integrated level of memory devices.

Figure 15A:
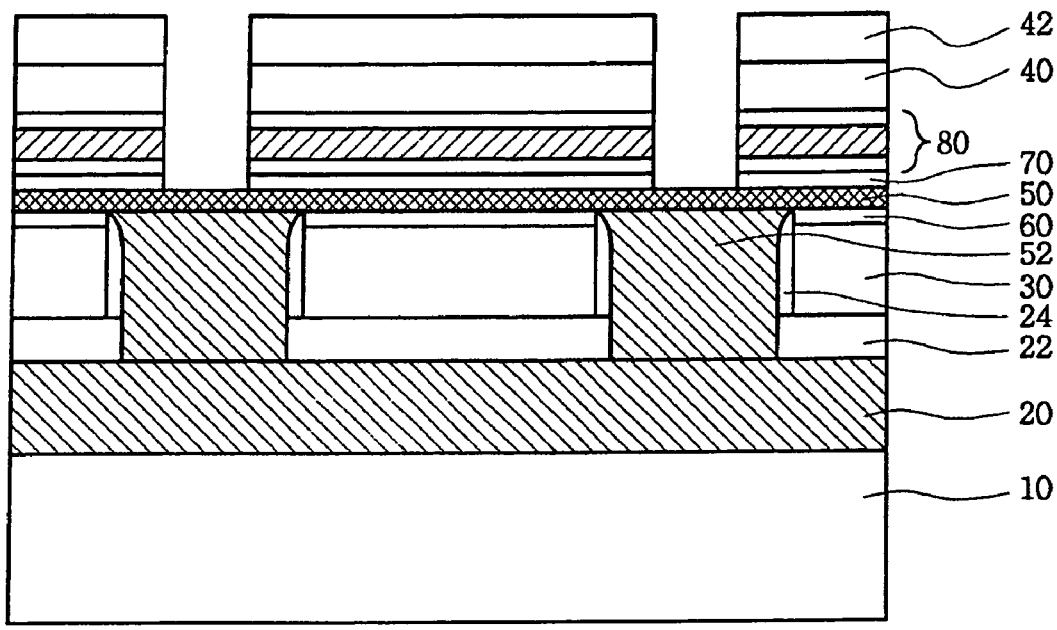
Figure 15B:
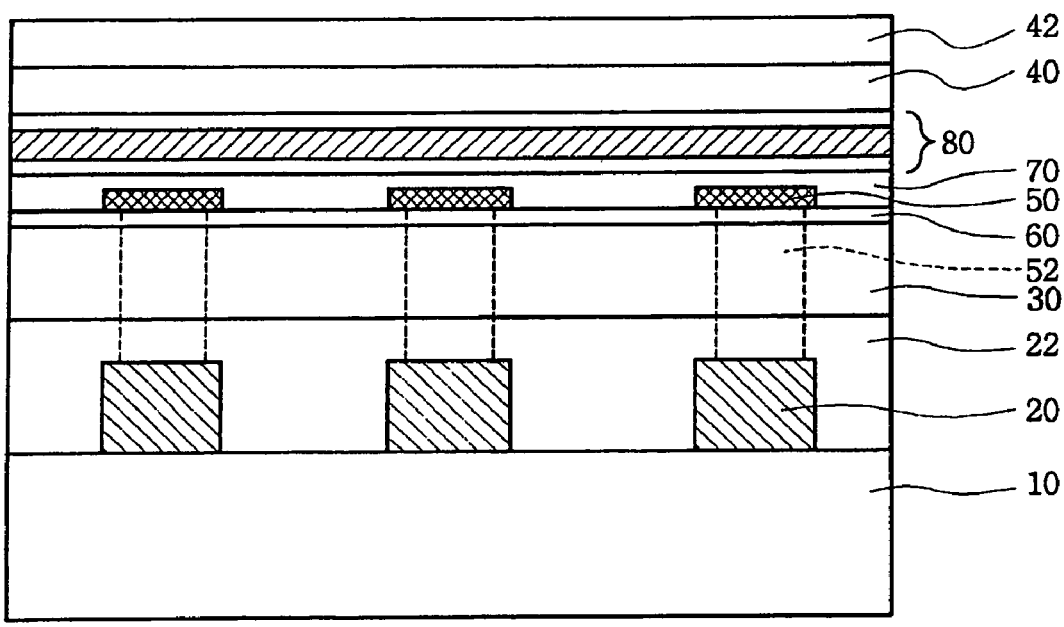

As illustrated in FIGS. 15A and 15B, on the cantilever electrode 50, a second sacrifice layer 70, a trap site 80 and an upper word line 40 in parallel with the spacer 24, first sacrifice layer 60, lower word line 30 and first interlayer insulating film are formed in the second direction. The second sacrifice layer 70, trap site 80 and upper word line 40 are formed herein symmetrically to the first sacrifice layer 60 and the lower word line 30, with the cantilever electrode 50 therebetween. In an embodiment, the first sacrifice layer 70 is formed of polysilicon material by an atomic layer deposition or CVD, similar to the first sacrifice layer 60, and has the thickness of about 50 Å to about 150 Å. The trap site 80 includes a first silicon oxide layer 82, silicon nitride layer 84 and second silicon oxide layer 86 each having a thickness of about 100 Å, 200 Å and 100 Å, by CVD. The upper word line 40 is formed with a thickness of about 200 Å. The second sacrifice layer 70 and the upper word line 40 are formed to each have a line width of about 50 Å. At this time, the second sacrifice layer 70, trap site 80 and upper word line 40 may be formed as follows.

On an entire face of the substrate 10 on which the cantilever electrode 50 has been formed, a polysilicon layer of a given thickness, first silicon oxide layer 82, silicon nitride layer 84, second silicon oxide layer 86, conductive metal layer and fourth mask layer 42 are sequentially stacked by CVD or other deposition process.

Then, a photoresist pattern is formed, the photoresist pattern being for shielding the fourth hard mask layer 42 that is formed on the spacer 24, cantilever electrode 50, first sacrifice layer 60, lower word line 30 and first interlayer insulating film 24. Subsequently, the fourth hard mask layer 42 is removed by a dry etching method or wet etching method that uses the photoresist pattern as an etching mask. Then, the photoresist pattern is removed by an ashing process. Finally, the conductive metal layer, second silicon oxide layer 86, silicon nitride layer 84, first silicon oxide layer 82 and polysilicon layer are sequentially etched aeolotropically through the dry or wet etching method that uses the fourth hard mask layer 42 as the etching mask, thereby forming the upper word line 40, trap site 80 and second sacrifice layer 70. At this time, in patterning the second sacrifice layer 70, trap site 80 and upper word line 40, the cantilever electrode 50 formed on the pad electrode 52 may be exposed.

Consequently, in a multibit electro-mechanical memory device and method of manufacturing the same according to some embodiments of the invention, a stacked structure of the second sacrifice layer 70, trap site 80 and upper word line 40 on the cantilever electrode 50 are adapted, thereby increasing the integration of memory devices.

Figure 18A:
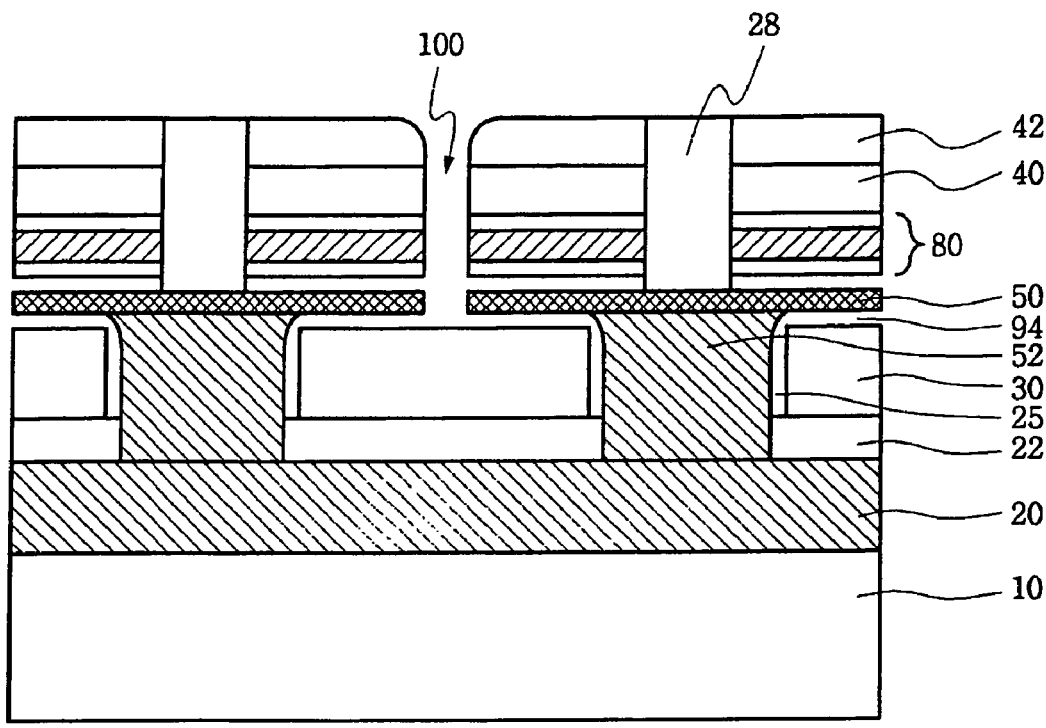

When the void 94 is obtained by removing the second sacrifice layer 70 in a subsequent process, for example, as shown in FIG. 18A, and when void 94 is below a lower part of the trap site 80 and upper word line 40 of the stack structure, the length of the cantilever electrode 50 to be electrically switched is reduced within the void 94, thereby simply forming the cantilever electrode 50 of micro structure and so increasing the yield.

Figure 16A:
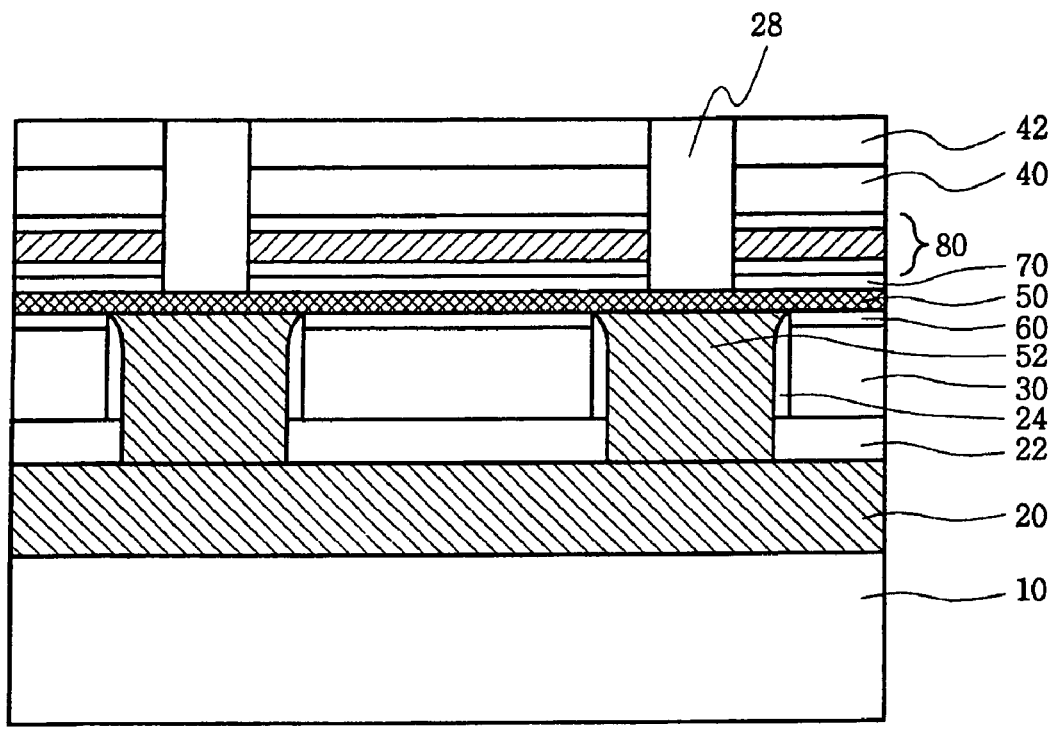
Figure 16B:
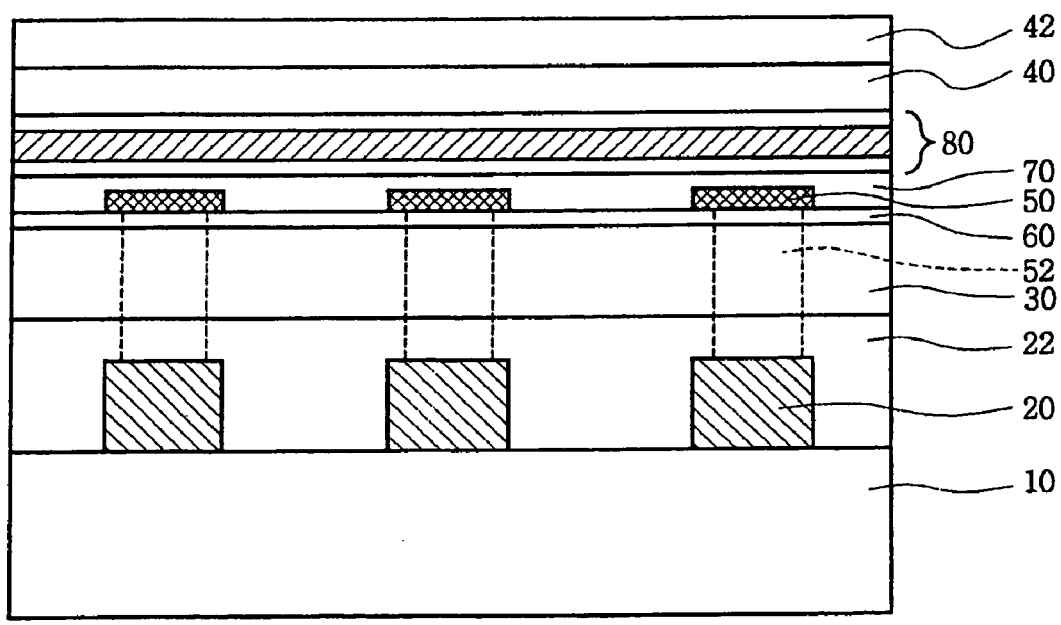

As shown in FIGS. 16A and 16B, a second interlayer insulating film 28 of a given thickness is formed on the cantilever electrode 50 formed on the pad electrode 52, the fourth hard mask layer 42 and the spacer 24, and the second interlayer insulating film 28 is planarized to expose the fourth hard mask layer 42. The second interlayer insulating film 28 has the same as or similar thickness to the second sacrifice layer 70, trap site 80, and upper word line 40, or has a thickness thicker than that of the second sacrifice layer 70, trap site 80, and upper word line 40. Thus, when the second sacrifice layer 70 is removed in a subsequent process, the second interlayer insulating film 28 supports a side face of the trap site 80 and the upper word line 40, thereby adapting the trap site 80 and the upper word line 40, which are supported by the second interlayer insulating film 28, and which suspend above the cantilever electrode 50. For example, the second interlayer insulating film is formed including a silicon oxide layer formed by a plasma CVD. Further, the second interlayer insulating film 28 may be planarized by a chemical mechanical polishing. At this time, when the second interlayer insulating film 28 is planarized by using the upper word line 40 as an etch stop layer, the upper word line 40 formed of conductive metal layer may be damaged. Thus, the fourth hard mask layer 42 should be used as the etch stop layer. When the fourth hard mask layer 42 is excessively removed, the thickness of the fourth hard mask layer 42 may be increased by depositing a silicon nitride layer on the fourth hard mask layer 42.

Figure 17A:
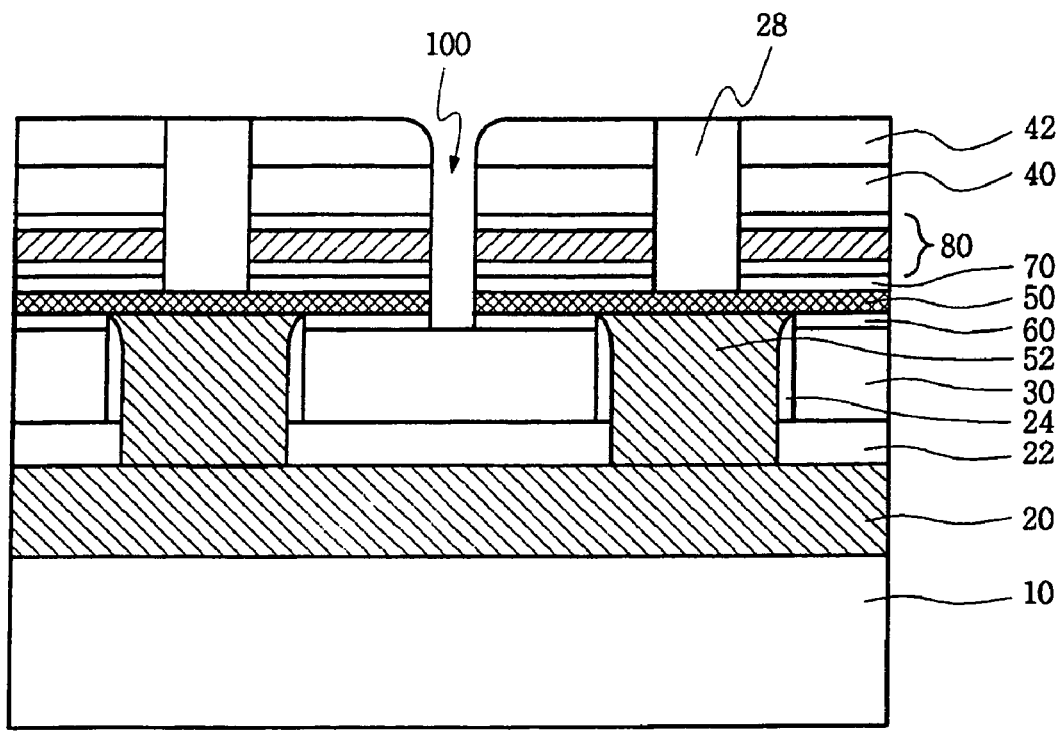
Figure 17B:
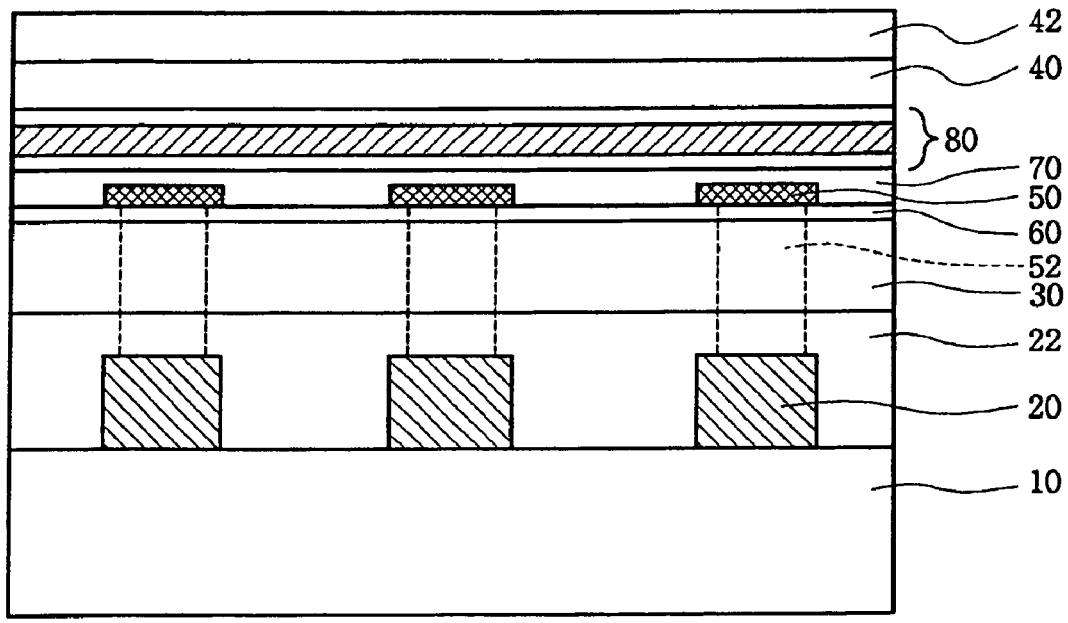

With reference to FIGS. 17A and 17B, the fourth hard mask layer 42 is etched by a dry etching method that uses a photoresist pattern as an etching mask, the photoresist pattern being for exposing, in a second direction, a center of the fourth hard mask 42 formed on the upper word line 40. And then, the photoresist pattern is removed. The upper word line 40, trap site 80, second sacrifice layer 70, cantilever electrode 50, first sacrifice layer 60 and lower word line 30 are sequentially removed by a dry etching method using the fourth hard mask layer 42 as the etching mask, thus forming trench 100 that exposes the first interlayer insulating film. The trench 100 is formed to separate, in the second direction, the upper word line 40, trap site 80 and lower word line 30, and to separate a node of the cantilever electrode 50, and furthermore, to easily remove the first and second sacrifice layers 60 and 70. For example, a reactive gas used for the dry etching method may be a gas of FC-group such as $C_xF_y$ group or $C_aH_bF_c$ group, etc. The gas of FC-group may be gas such as $CF_4$, $CHF_3$, $C_2F_6$, $C_4F_8$, $CH_2F_2$, $CH_3F$, $CH_4$, $C_2H_2$, $C_4F_6$, etc. or their mixture gas. The trench 100 has a given line width to separate symmetrically in the first direction the upper word line 40, second sacrifice layer 70, cantilever electrode 50, first sacrifice layer 60 and lower word line 30. And, in a subsequent process, etchant solution or reactive gas to isotropically eliminate the first and second sacrifice layers 60 and 70 formed in a lower part of the trap site 80 may easily flow into the trench 100. The trench 100 may be formed herein with a line width of about 30 Å to 800 Å.

Figure 18B:
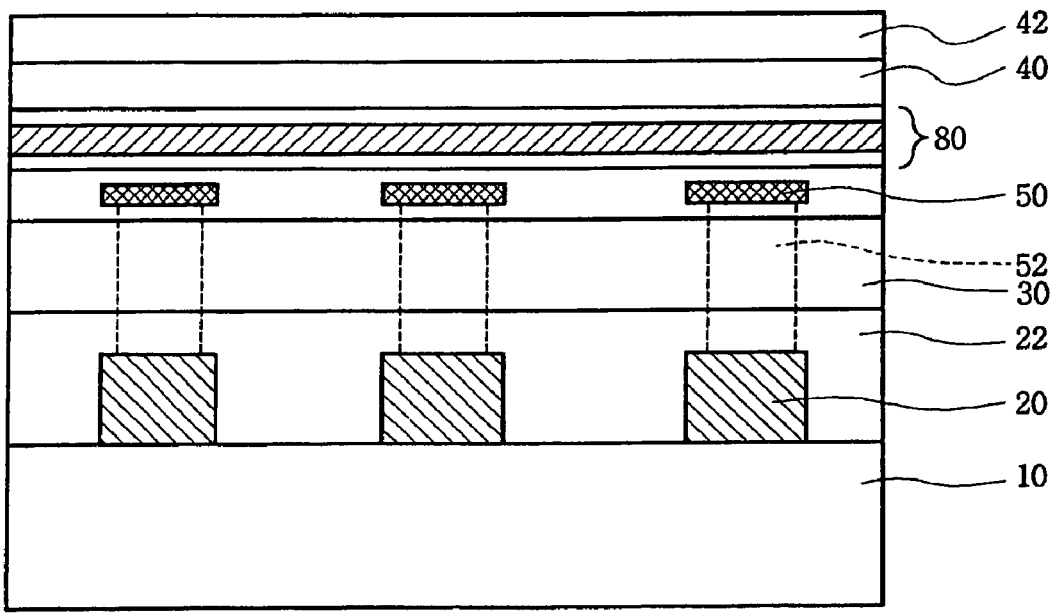

As shown in FIGS. 18A and 18B, the first sacrifice layer 60, second sacrifice layer 70 and spacer 24 exposed to the trench 100 are removed, thus forming a void 94 through which the cantilever electrode 50 is suspended between the lower word line 30 and the upper word line 40. In one embodiment, when the spacer 24 is formed of silicon nitride layer, the spacer 24 may remain intact. In another embodiment, when formed of polysilicon layer, the spacer 24 may be removed together with the first and second sacrifice layers 60 and 70. For example, the first or second sacrifice layers 60 and 70, or the spacer 24 may be isotropically etched and removed from a portion exposed to a sidewall of the trench 100 into a side direction through the wet or dry etching method. Etchant solution used for the wet etching method of the first, second sacrifice layer or spacer 24 formed of polysilicon material may be mixture solution obtained by mixing a strong acid such as nitric acid, HF and acetic acid with deionized water by a given density. Reactive gas used for the dry etching method of the first and second sacrifice layers 60 and 70 may be gas of FC-group such as $CF_4$, $CHF_3$, etc. Etchant solution or etching gas used for the wet or dry etching method horizontally eliminates the first sacrifice layer 60, the second sacrifice layer 70 or the spacer 24 exposed to a sidewall of the trench 100, thereby forming the void 94 between the upper and lower word lines 40 and 30. The void 94 defines a distance that the cantilever electrode 50 is curved and switched, and may be defined as a space between the trap site 80 and the lower word line 30. At this time, the trap site 80 may prevent the upper word line 40 from being damaged by etching solution or gas etching the second sacrifice layer 70, during flowing into the trench 100, or depressed into a lower part of the void 94, in forming the void 94.

Accordingly, in a multibit electro-mechanical memory device according to an embodiment of the invention, the first sacrifice layer 60 exposed to the trench 100, the second sacrifice layer 70 or the spacer 24 is removed, and thus the cantilever electrode 50 can be curved to perform an electrical switching operation within the void 94 between the trap site 80 and the lower word line 30.

Although not shown in the drawings, in an embodiment, a third interlayer insulating film 110 (see, for example, FIG. 4) covers an upper part of the trench 100, and seals or otherwise encapsulates up the inside of the trench 100. In an embodiment, the void 94 inside the trench 100 can be filled with a non-reactive gas such as nitrogen in air or argon, and may be determined to have a vacuum state to increase a curved speed of the cantilever electrode 50. For example, the third interlayer insulating film 110 is formed of polymer material that does not flow into the inside of the trench 100, but covers an upper part of the second interlayer insulating film 28 or the upper word line 40 formed on the trench 100. In addition, a memory device having a multilayer structure may be manufactured by sequentially forming another bit line 20, lower word line 30, cantilever electrode 50 and upper word line 40 on an upper part of the substrate 10 on which the third interlayer insulating film 110 has been formed.

Consequently, in a method of manufacturing a multibit electro-mechanically memory device according to embodiments of the invention, plural lower word lines 30, cantilever electrodes 50, trap sites 80 and upper word lines 40 can be formed symmetrically by using a trench 100 that is formed in a second direction that intersects an upper part of bit line 20 formed in a first direction on substrate 10, thereby increasing an integrated level of the memory device.

As described above, according to some embodiments of the invention, to curve a cantilever electrode into a third direction and maintain the curved state, an upper word line to which a given charge is applied, and a trap site having a stacked structure are adapted. Accordingly, the length of cantilever electrode is reduced as compared with the conventional art, and additionally, conventional electrical contact portion and attractive portion can be unified on a vertical line, thereby increasing or increasing at most an integration of memory devices.

Furthermore, a void is formed in a lower part of trap site and upper word line having the stack structure, whereby reducing the length of the cantilever electrode formed to be electrically switched within the void and so simply forming the cantilever electrode of a microstructure to increase the yield at most.

First and second cantilever electrodes separated into both sides on a trench or pad electrode are formed to include a unit cell that is classified as first and second memory units performing a separate switching operation. Thus, there is an effect to input/output data of two or more bits to/from each unit cell.

While the present invention has been particularly shown and described with reference to exemplary embodiments thereof, it will be understood by those skilled in the art that various changes in form and details may be made therein without departing from the spirit and scope of the present invention as defined by the appended claims. Accordingly, these and other changes and modifications are seen to be within the true spirit and scope of the invention as defined by the appended claims.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. Accordingly, these and other changes and modifications are seen to be within the true spirit and scope of the invention as defined by the appended claims.

What is claimed is:

1. A multibit electro-mechanical memory device, comprising:
   a substrate;
   a bit line extending in a first direction on the substrate;
   a first interlayer insulating film on the bit line;
   first and second lower word lines on the first interlayer insulating film, the first and second lower word lines separated horizontally from each other by a trench, and extending in a second direction that intersects the first direction;
   a spacer abutting a sidewall of each of the first and second lower word lines;
   a pad electrode inside a contact hole, wherein the contact hole is formed by removing a portion of the first interlayer insulating film exposed to the spacer on the bit line;
   first and second cantilever electrodes suspended over first and second lower voids that correspond to upper parts of the first and second lower word lines provided in both sides on the pad electrode, the first and second cantilever electrodes being separated from each other by the trench, and being curved in a third direction that is perpendicular to the first and second direction;

a second interlayer insulating film on the pad electrode;

first and second trap sites supported by the second interlayer insulating film to have first and second upper voids on the first and second cantilever electrodes; and first and second upper word lines on the first and second trap sites.

2. The device of claim 1, wherein the first interlayer insulating film covers an upper part of the bit line except the contact hole.

3. The device of claim 1, wherein the spacer comprises a side face abutting the first and second lower word lines, and comprises a silicon nitride layer formed between the first and second cantilever electrodes or a side space thereof.

4. The device of claim 1, wherein the first and second trap sites have a stacked structure comprising a first silicon oxide layer, a silicon nitride layer, and a second silicon oxide layer.

5. The device of claim 1, further comprising a third interlayer insulating film that seals the trench at an upper part of the trench.

6. The device of claim 1, wherein the first direction corresponds to an Z-axis direction, the second direction corresponds to a Y-axis direction and the third direction corresponds to a Z-axis direction.

7. A multibit electro-mechanical memory device, comprising:

a substrate;

a bit line extending in a first direction on the substrate;

a first interlayer insulating film on the bit line;

first and second lower word lines on the first interlayer insulating film, the first and second lower word lines separated horizontally from each other by a trench, and extending in a second direction that intersects the first direction;

a spacer abutting a sidewall of each of the first and second lower word lines;

a pad electrode on the bit line;

first and second cantilever electrodes suspended over first and second lower voids that correspond to upper parts of the first and second lower word lines provided at both sides of the pad electrode, the first and second cantilever electrodes being separated from each other by the trench, and being curvable in a third direction that is perpendicular to the first and second directions;

a second interlayer insulating film on the pad electrode;

first and second trap sites supported by the second interlayer insulating film to have first and second upper voids above the first and second cantilever electrodes, wherein lower surfaces of each of the first and second trap sites are co-planar; and first and second upper word lines on the first and second trap sites, wherein the spacer comprises a side face abutting the first and second lower word lines, and comprises a silicon nitride layer formed between the first and second cantilever electrodes or a side space thereof.

8. The device of claim 7, wherein the first interlayer insulating film covers an upper part of the bit line exclusive of a portion of the upper part of the bit line having the pad electrode on the upper part of the bit line.

9. The device of claim 7, wherein the first and second trap sites have a stacked structure comprising a first silicon oxide layer, a silicon nitride layer, and a second silicon oxide layer.

10. The device of claim 7, further comprising a third interlayer on an upper surface of the second interlayer insulating film.

11. The device of claim 10, wherein the third interlayer insulating film seals the trench at an upper part of the trench.

12. The device of claim 11, wherein the sealed trench is in a vacuum state.

13. The device of claim 11, wherein the sealed trench is filled with a non-reactive gas.

14. The device of claim 13, wherein the non-reactive gas comprises nitrogen gas.

15. The device of claim 13, wherein the non-reactive gas comprises argon gas.

16. The device of claim 7, wherein the first direction corresponds to an Z-axis direction, the second direction corresponds to a Y-axis direction and the third direction corresponds to a Z-axis direction.

* * * * *